US011264207B2

(12) United States Patent
Kim et al.

(10) Patent No.: US 11,264,207 B2
(45) Date of Patent: *Mar. 1, 2022

(54) APPARATUSES AND METHODS FOR AVOIDING ELECTRICAL BREAKDOWN FROM RF TERMINAL TO ADJACENT NON-RF TERMINAL

(71) Applicant: Lam Research Corporation, Fremont, CA (US)

(72) Inventors: Hyungjoon Kim, Beaverton, OR (US); Sunil Kapoor, Vancouver, WA (US); Karl Leeser, West Linn, OR (US); Vince Burkhart, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/855,666

(22) Filed: Apr. 22, 2020

(65) Prior Publication Data
US 2020/0251307 A1    Aug. 6, 2020

Related U.S. Application Data

(63) Continuation of application No. 16/525,333, filed on Jul. 29, 2019, now Pat. No. 10,636,624, which is a
(Continued)

(51) Int. Cl.
*H01J 37/32* (2006.01)
*H01L 21/68* (2006.01)
(Continued)

(52) U.S. Cl.
CPC ...... *H01J 37/32082* (2013.01); *C23C 16/505* (2013.01); *H01J 37/32009* (2013.01);
(Continued)

(58) Field of Classification Search
CPC .......... H01J 37/32082; H01J 37/32091; H01J 37/32706; H01J 37/32009; H01J 37/3244;
(Continued)

(56) References Cited

U.S. PATENT DOCUMENTS 8,237,517 B2 * 8/2012 Shannon ................. H03H 7/38
333/17.3
10,510,515 B2 * 12/2019 Collins ............. C23C 16/45578

* cited by examiner

*Primary Examiner* — Vibol Tan
(74) *Attorney, Agent, or Firm* — Penilla IP, APC

(57) ABSTRACT

An isolation system includes an input junction coupled to one or more RF power supplies via a match network for receiving radio frequency (RF) power. The isolation system further includes a plurality of channel paths connected to the input junction for distributing the RF power among the channel paths. The isolation system includes an output junction connected between each of the channel paths and to an electrode of a plasma chamber for receiving portions of the distributed RF power to output combined power and providing the combined RF power to the electrode. Each of the channel paths includes bottom and top capacitors for blocking a signal of the different type than that of the RF power. The isolation system avoids a risk of electrical arcing created by a voltage difference between an RF terminal and a non-RF terminal when the terminals are placed proximate to each other.

20 Claims, 15 Drawing Sheets

Related U.S. Application Data continuation of application No. 16/038,076, filed on Jul. 17, 2018, now Pat. No. 10,373,805, which is a continuation of application No. 15/048,796, filed on Feb. 19, 2016, now Pat. No. 10,043,636.

(60) Provisional application No. 62/265,605, filed on Dec. 10, 2015.

(51) Int. Cl.
*H01L 21/683* (2006.01)
*C23C 16/505* (2006.01)
*H01L 21/687* (2006.01)

(52) U.S. Cl.
CPC .... *H01J 37/3244* (2013.01); *H01J 37/32091* (2013.01); *H01J 37/32174* (2013.01); *H01J 37/32577* (2013.01); *H01J 37/32697* (2013.01); *H01J 37/32706* (2013.01); *H01J 37/32715* (2013.01); *H01L 21/6831* (2013.01); *H01J 2237/332* (2013.01); *H01J 2237/334* (2013.01); *H01L 21/68764* (2013.01); *H01L 21/68771* (2013.01)

(58) Field of Classification Search
CPC .......... H01J 37/32577; H01J 37/32697; H01J 2237/332; H01J 2237/334; H05H 1/46; H05H 1/00; H05H 2001/466; H05H 1/22; H05H 1/02; Y10S 901/30; C23C 16/505; C23C 16/513; H01L 21/6831; H01L 21/68764; H01L 21/68771
See application file for complete search history.

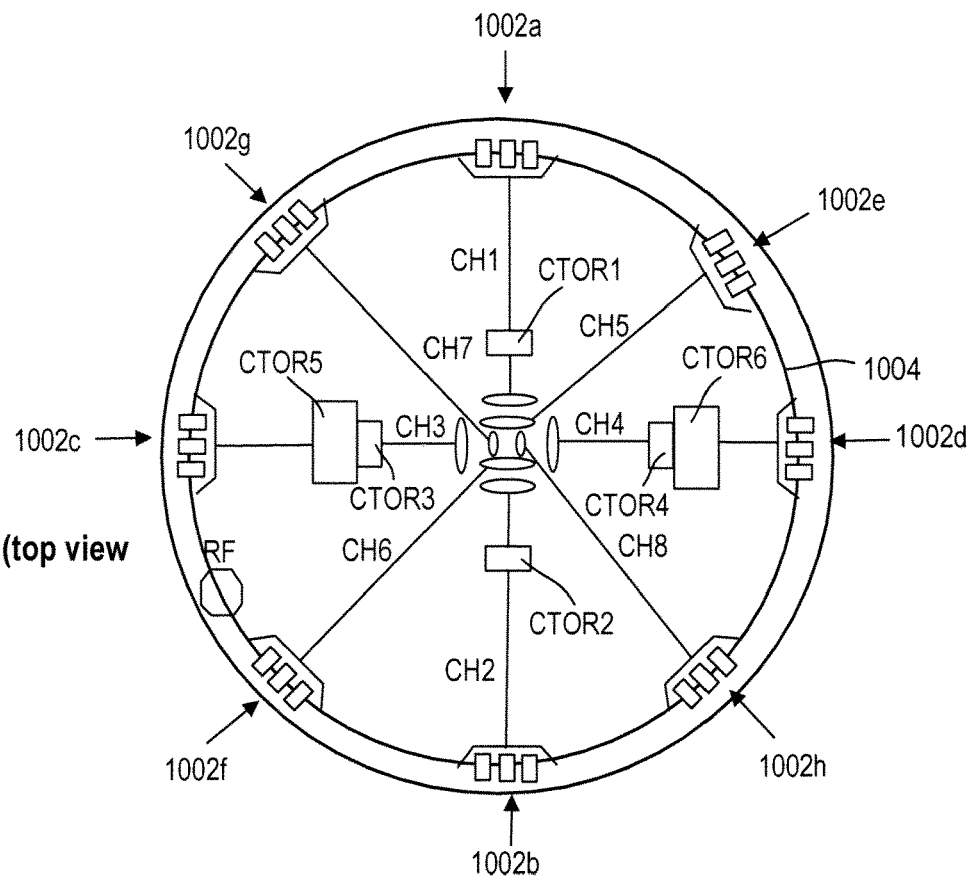
FIG. 10A (top view of plate)
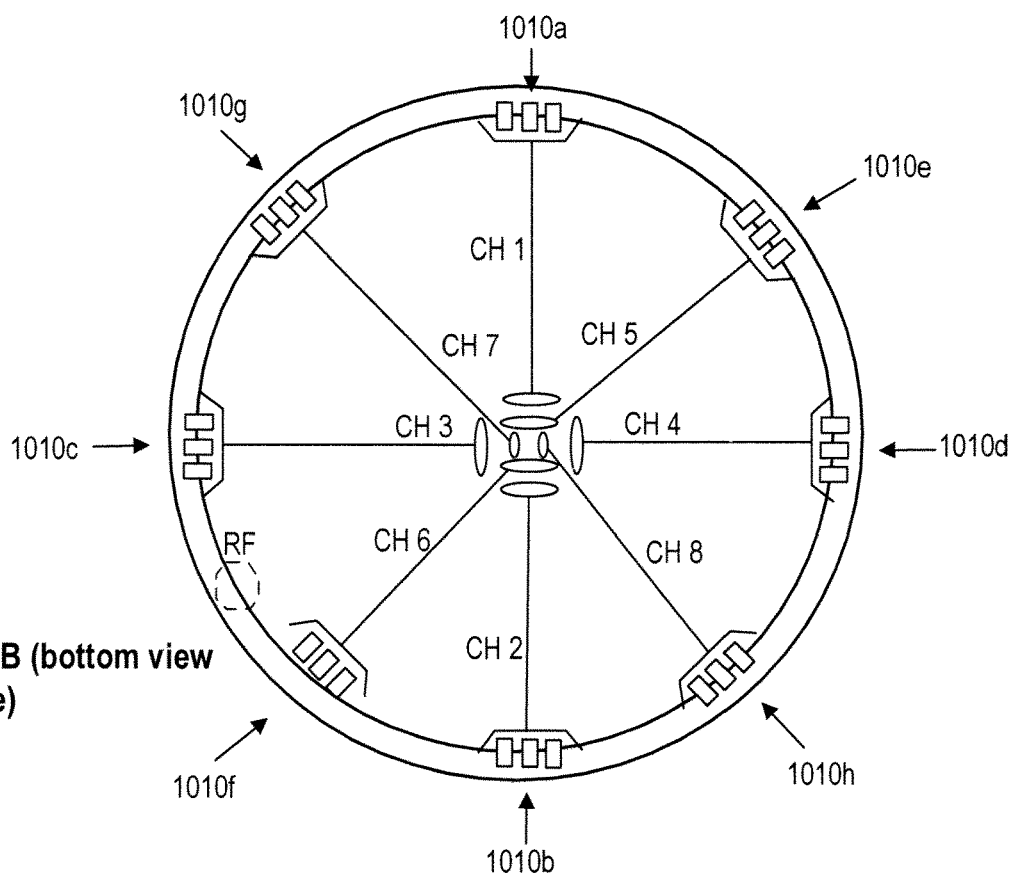
FIG. 10B (bottom view of plate)

APPARATUSES AND METHODS FOR AVOIDING ELECTRICAL BREAKDOWN FROM RF TERMINAL TO ADJACENT NON-RF TERMINAL

CLAIM OF PRIORITY

This application is a continuation of and claims the benefit of and priority, under 35 U.S.C. § 120, to U.S. patent application Ser. No. 16/525,333, filed on Jul. 29, 2019, and titled "Apparatuses and Methods for Avoiding Electrical Breakdown From RF Terminal to Adjacent Non-RF Terminal", which is a continuation of and claims the benefit of and priority, under 35 U.S.C. § 120, to U.S. patent application Ser. No. 16/038,076, filed on Jul. 17, 2018, titled "Apparatuses and Methods for Avoiding Electrical Breakdown From RF Terminal to Adjacent Non-RF Terminal", and issued as U.S. Pat. No. 10,373,805, which is a continuation of and claims the benefit of and priority, under 35 U.S.C. § 120, to U.S. patent application Ser. No. 15/048,796, filed on Feb. 19, 2016, titled "Apparatuses and Methods for Avoiding Electrical Breakdown From RF Terminal to Adjacent Non-RF Terminal", and issued as U.S. Pat. No. 10,043,636, which claims the benefit of and priority, under 35 U.S.C. § 119(e), to U.S. Provisional Patent Application No. 62/265,605, filed on Dec. 10, 2015, and titled "Isolation from RF Mixed Signal", all of which are hereby incorporated by reference herein in their entirety.

FIELD

The present embodiments relate to systems and methods for using a slip ring for transferring radio frequency (RF) power and non-RF power via multiple adjacent channels and for achieving alternating current (AC) or direct current (DC) isolation from RF mixed signals.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer. One such reactor is a plasma enhanced chemical vapor deposition (PECVD) reactor.

For example, a PECVD reactor may be used to deposit insulation films such as silicon oxide (SiO), silicon nitride (SiN), silicon carbide (SiC), silicon oxide carbide (SiOC), and others. Conductor films may also be deposited using PECVD reactors. Such material films, to name a few examples, may include tungsten silicide (WSi), titanium nitride (TiN), aluminum (Al) alloy, etc. Depending on the type of film being deposited, specific reaction gases are brought into the PECVD reactor while radio frequency (RF) power is supplied to produce plasma that enables the deposition.

During the deposition process, power systems and circuitry are used to power various portions of the reactor, and set and/or monitor settings and operational parameters. One example parameter is temperature, e.g., which is controlled by heaters embedded in a substrate support of a reactor. By providing the power and monitoring the settings and operational parameters, the wafer is processed. However, processing of the wafer is performed using a different type of power than that used to power some of the portions of the reactor and than that used to monitor the setting and operational parameters. The different types of power interfere with each other and may also cause damage to some of the portions of the reactor. One solution is to provide a separation, e.g., a clearance distance, a creepage distance, etc., between various signal lines that transfer the different types of power to prevent electric arcing caused by the different types of power. However, there may be a breakdown depending on levels of voltage potential in the signal lines and materials of insulators of the signal lines. Moreover, when space within a reactor is limited, the solution may not be applicable.

It is in this context that embodiments described in the present disclosure arise.

SUMMARY

Embodiments of the disclosure provide systems and methods for using a slip ring for transferring both radio frequency (RF) power and non-RF power, e.g., direct current (DC) power, alternating current (AC) power, etc., via multiple adjacent channels and for achieving AC or DC isolation from RF mixed signals. It should be appreciated that the present embodiments can be implemented in numerous ways, e.g., a process, an apparatus, a system, a device, or a method on a computer-readable medium. Several embodiments are described below.

Different type of powers, e.g., RF power, AC power, or DC power, etc., share limited space inside a plasma chamber. For example, RF power is supplied to an electrode of the plasma chamber simultaneous with supply of AC power to a heater within the chamber and with reception of DC power generated by a thermocouple. If a voltage difference between adjacent signal lines that carry the different types of power is significant, there is a pre-determined amount of clearance and creepage distance maintained between the adjacent signal lines for supplying the AC or DC power and the RF power to prevent electrical breakage voltage, e.g., arcing, etc., between the signal lines. However, usually, space within the plasma chamber is limited. In such a case, it is not allowed to have enough physical distance or gap between the adjacent signal lines.

In various embodiments, an isolation system is provided within the plasma chamber. The isolation system includes adjacent channels of a slip ring. Each channel transfers both RF and non-RF power, e.g., AC power, DC power, etc. The transfer of both RF and non-RF power via each channel reduces chances of electric arcing between any two adjacent channels. The slip ring used is an off-the-shelf slip ring or a custom designed slip ring.

In some embodiments, an isolation system is provided within the plasma chamber to block the AC or DC power so that the electrode of the plasma chamber is protected from being damaged by the AC or DC power and an RF power supply is protected from being damaged by the AC or DC power. With use of capacitors to block the AC or DC power, distance between the adjacent lines is kept to a minimum to conform to the limited space available within the plasma chamber.

In several embodiments, in the isolation system, RF power is combined with AC or DC power in each channel of the isolation system. The combination of the RF power with the AC or DC power in conjunction with the blocking of AC or DC power facilitates reduction in space between two adjacent channels to conform to the limited space available with the plasma chamber.

In various embodiments, a method to share an RF signal and a non-RF signal, e.g., AC or DC signal, etc., in the limited space available with the plasma chamber is provided. The method includes providing a circuit that combines AC or DC power with RF power to generate combined power. Once the combined power is generated, AC or DC power is blocked by the circuit to reduce chances of damage by the AC or DC power to the electrode or the RF power supply. The combination of the AC or DC power with RF power occurs in the limited space.

If the clearance or creepage distance between a high voltage signal line and a low voltage signal line is not sufficient, there is decent chance to have an RF voltage breakdown between the two adjacent signal lines. So, in some embodiments, instead of having a single designated RF signal line among several terminals of the signal lines, all the channels are used to deliver RF power. With the even distribution of RF power among all the channels, RF voltage drop between two adjacent ones of the channels is zero or substantially zero volts, and the voltage breakdown due to RF power is prevented. The even distribution reduces chances of arcing of RF power between adjacent ones of the channels. At the same time, each channel is assigned to deliver either DC or AC power. Furthermore, on each channel, a capacitor is placed before a DC power input or an AC power input, and another one after a DC power input or an AC power output. In the isolation system, RF power and non-RF power, e.g., AC power, DC power, etc., share the same delivery path, and non-RF power is isolated by the capacitors of the channels. The isolation by the capacitors protects the electrode and the RF power supply from being adversely affected by the AC or DC power.

Also, in various embodiments, power sources that provide AC or DC power to the heater and controllers that receive voltage signals from thermocouples that measure temperature of the heater are protected from RF power by using RF filters at points before and after portions of the channels that combine RF power with AC or DC power.

In some embodiments, each channel of the isolation system is assigned an amount of AC or DC power. Although there is no or minimal RF potential difference between the channels by distributing the RF power equally or substantially equally among all the channels, there are voltage drops from the AC or DC power. The highest AC or DC voltage is assigned to a channel CH1 and the lowest AC or DC voltage is assigned to a channel CH8 from multiple channels CH1 through CH8 of the isolation system. With the assignment, the isolation system achieves AC or DC voltage drops that are evenly distributed among the channels CH1 thru CH8. The even distribution minimizes a risk of arcing or other permanent electrical damage to components of the plasma chamber.

In some embodiments, an isolation system is described. The isolation system includes a top interface plate including a first array of capacitors. The first array includes multiple groups of capacitors and each group of capacitors of the first array is associated with one of a plurality of channels. The isolation system further includes a bottom interface plate including a second array of capacitors. The second array includes multiple groups of capacitors. Each group of capacitors of the second array is associated with one of a plurality of channels. The top interface plate rotates and the bottom interface plate is configured to be fixed. The isolation system further includes a slip ring connected to the channels of the top interface plate and the channels of the bottom interface plate. The slip ring transfers both RF power and non-RF power between the top interface plate and the bottom interface plate. Each of the first array of capacitors and the second array of capacitors blocks the non-RF power.

Some advantages of the embodiments described herein include reducing a clearance or creepage distance required to be maintained between two adjacent signal lines. The clearance or creepage distance is reduced by use of capacitors that block AC or DC power transferred within the channels and also by distributing RF power and non-RF power among the channels. For example, each channel of the isolation system transfers an RF signal and a non-RF signal simultaneously. The blocking of AC or DC power by the capacitors of the channels in conjunction with the distribution of RF and non-RF power facilitates reduction of distance between two adjacent channels. The reduction of distance facilitates fitting of the isolation system within a pre-determined amount of space within the plasma chamber.

Further advantages of the embodiments described herein include avoiding a risk of electrical arcing, which is created by a voltage difference between an RF signal line and a non-RF signal line, e.g., a terminal that is used to transfer DC power or AC power, etc., when both the signal lines are located proximate, e.g., adjacent, etc., to each other. To avoid such arcing, in some embodiments, an off-the-shelf slip ring is used and both RF and non-RF signals are transferred via each channel of the slip ring. There is minimal voltage drop between two adjacent channels of the slip ring and the voltage drop is within confines of a manufacturing specification defining a maximum allowable voltage drop associated with the slip ring.

Advantages of the embodiments described herein include protecting the electrode or the RF power supply from damage by AC or DC power. The capacitors block AC or DC power to reduce a probability of damage to the electrode and to the RF power supply.

Additional advantages include using a single slip ring between a top portion and a bottom portion of the isolation system. In conventional systems, multiple slip rings of different types are used. For example, a dry type slip ring is used to provide one type of power and a wet slip ring is used to provide another type of power. Comparatively, in the isolation system, the single slip ring, either of the dry type or of the wet type, is used.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 10A is a top view of a top plate of the isolation system or a bottom view of a bottom plate of an isolation system, in accordance with various embodiments described in the present disclosure.

FIG. 10B is a bottom view of the top plate or a top view of the bottom plate, in accordance with some embodiments described in the present disclosure.

DETAILED DESCRIPTION

Figure 1:
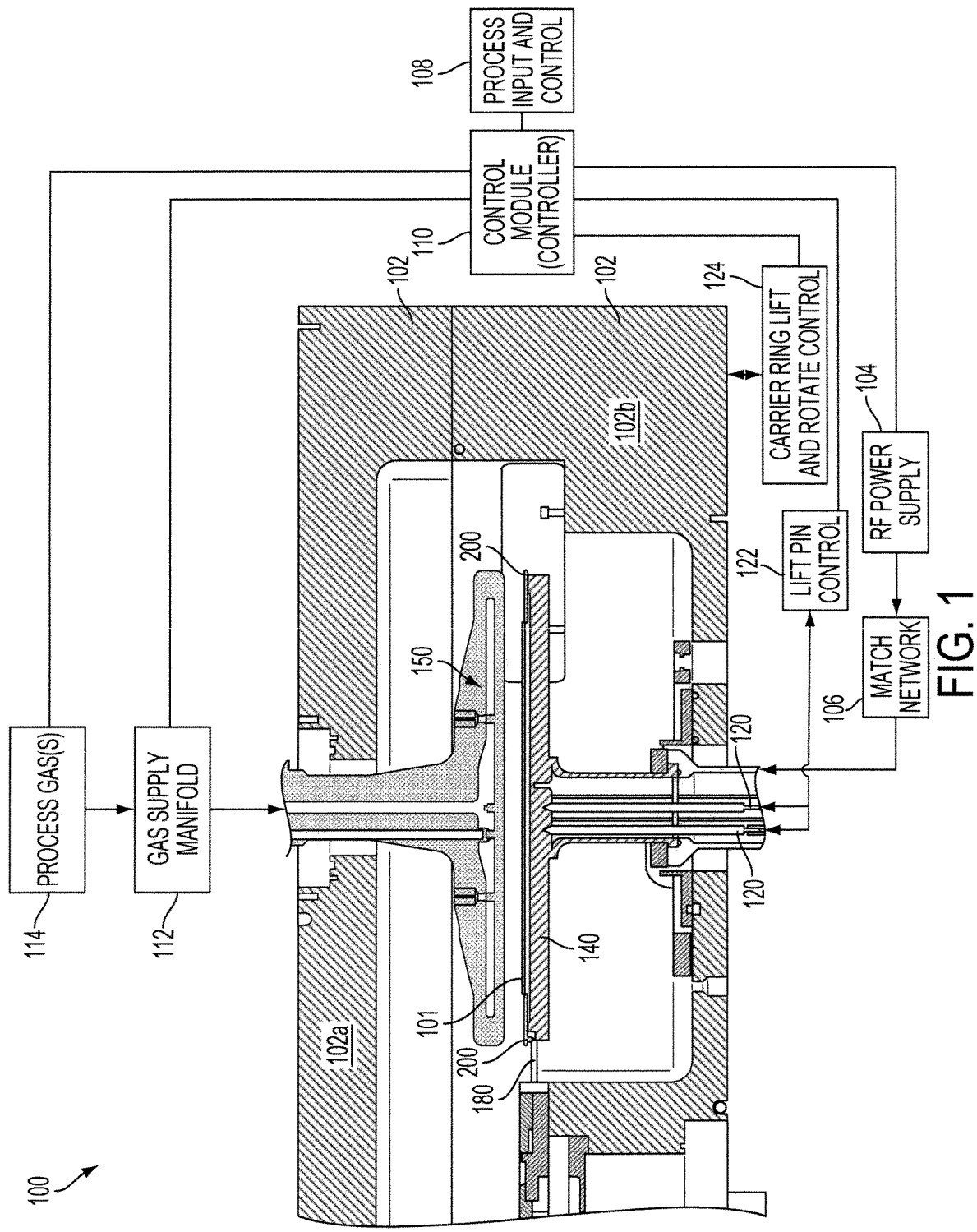
FIG. 1 illustrates a substrate processing system, which is used to process a wafer, in accordance with some embodiments described in the present disclosure.

The following embodiments describe systems and methods for achieving alternating current (AC) or direct current (DC) isolation from radio frequency (RF) mixed signals. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more plasma chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, e.g., a wafer chuck, etc., and/or other wafer holding apparatus. For certain operations, the apparatus may include a heater such as a heating plate to heat the wafer and a set of thermocouples to measure temperature during processing the wafer. Moreover, a motor is provided to rotate the pedestal during the processing of the wafer.

In some embodiments, an isolation circuit is provided. The isolation circuit includes channels that receive RF power for distribution among the channels. The distribution of RF power among the channels reduces a difference in impedance of power between two adjacent channels to decrease chances of arcing between the adjacent channels. For example, in a system in which one path supplies AC or DC power and another supplies RF power, there is a chance of arching between the two paths. When all the channels supply RF power as well as AC or DC power, chances of arcing between two adjacent channels is reduced.

In various embodiments, each of the channels includes filters, e.g., top capacitors, bottom capacitors, etc., that block AC or DC power. The blocking of AC or DC power by the top capacitors decreases possibilities of damage to an electrode to which RF power is provided via the channels. Moreover, the blocking of AC or DC power by the bottom capacitors decreases chances of damage to an RF power supply that supplies RF power, which is distributed among the channels.

In several embodiments, the channels of the isolation system are not spaced apart from each other. For example, there is a distance of a few millimeters between two adjacent channels. The blocking of AC or DC power and the distribution of RF power among the channels facilitates the reduction in distance. The reduction in distance allows the isolation system to fit within a limited space in the plasma chamber.

FIG. 1 illustrates a substrate processing system 100, e.g., a PECVD system, etc., which is used to process a wafer 101. The substrate processing system 100 includes a plasma chamber 102 having a lower chamber portion 102b and an upper chamber portion 102a. A center column is configured to support a pedestal 140, which in one embodiment is a powered electrode. The pedestal 140 is electrically coupled to a radio frequency (RF) power supply 104 via a match network 106. The RF power supply 104 is controlled by a control module 110, e.g., a controller, etc. Examples of a controller include a processor and a memory device. The processor, for example, is an application specific integrated circuit (ASIC), a programmable logic device (PLD), a central processing unit (CPU), or a microprocessor, etc. Examples of the memory device include a read-only memory (ROM), a random access memory (RAM), a redundant array of storage disks, a hard disk, a Flash memory, etc. The control module 110 operates the substrate processing system 100 by executing a process input and control 108. The process input and control 108 includes process recipes, such as power levels, timing parameters, process gasses, mechanical movement of the wafer 101, etc., so as to deposit or form films over the wafer 101.

The center column is also shown to include lift pins 120, which are controlled by a lift pin control 122. The lift pins 120 are used to raise the wafer 101 from the pedestal 140 to allow an end-effector to pick the wafer 101 and to lower the wafer 101 after being placed by the end end-effector. The substrate processing system 100 further includes a gas supply manifold 112 that is connected to process gases 114, e.g., gas chemistry supplies from a facility, etc. Depending on the processing being performed, the control module 110 controls the delivery of the process gases 114 via the gas supply manifold 112. The chosen gases are then flown into a shower head 150 and distributed in a space volume, e.g., a gap, etc., defined between the showerhead 150 face that faces that wafer 101 and the pedestal 140.

Further, the gases may be premixed or not. Appropriate valving and mass flow control mechanisms may be employed to ensure that the correct gases are delivered during the deposition and plasma treatment phases of the process. Process gases exit the plasma chamber 102 via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is sits over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which lift the wafer 101 when the carrier ring 200 is lifted by spider forks 180. The carrier ring 200 is therefore lifted along with the wafer 101 and can be rotated to another station, e.g., in a multi-station system.

In an embodiment, an upper electrode within the showerhead 150 is grounded when RF power is supplied from the RF power supply 104 to a lower electrode within the pedestal 140.

In one embodiment, instead of the pedestal 140 being electrically coupled to the RF power supply 104 via the match network 106, an electrode within the showerhead 150 is coupled to the RF power supply 104 via a match network for receiving power from the RF power supply 104 and the lower electrode within the pedestal 140 is grounded.

In some embodiments, the RF power supply 104 includes multiple RF generators that generate RF signals having different frequencies, e.g., an RF generator for generating an RF signal having a frequency RF1 and an RF generator for generating an RF signal having a frequency RF2.

Figure 2:
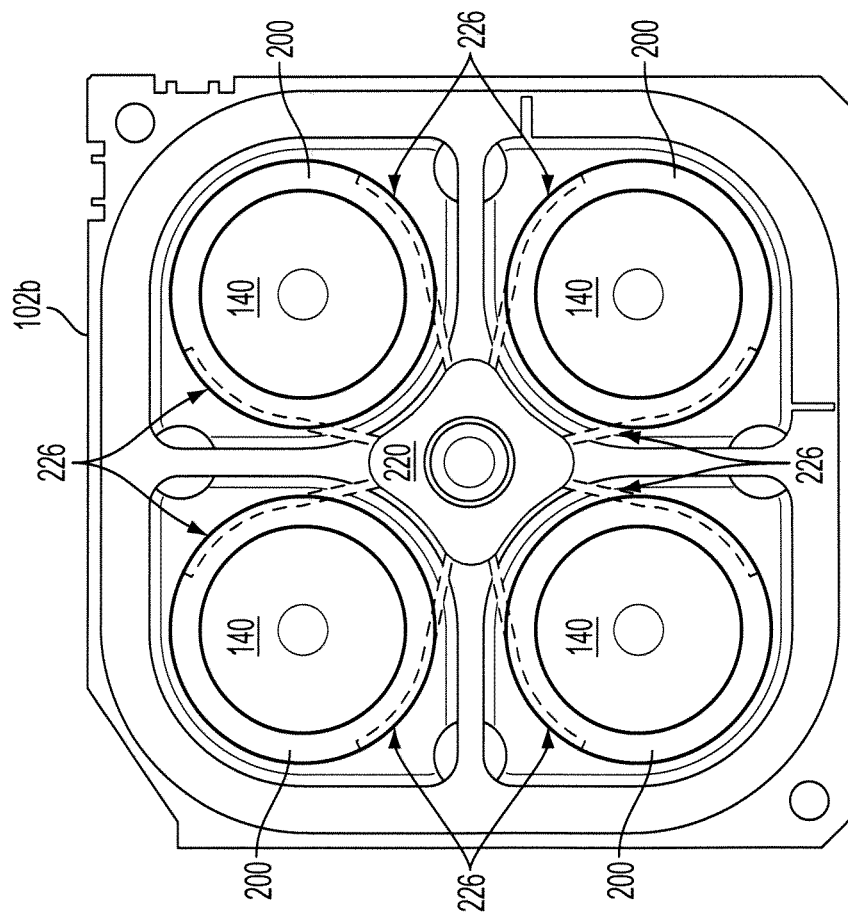
FIG. 2 illustrates a top view of a multi-station processing tool, where four processing stations are provided, in accordance with various embodiments described in the present disclosure.

FIG. 2 illustrates a top view of a multi-station processing tool, where four processing stations are provided. This top view is of the lower chamber portion 102b (e.g., with the top chamber portion 102a removed for illustration), where four stations are accessed by spider forks 226. In one embodiment, there is no isolation wall or other mechanism to isolate one station from another. Each spider fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate between two or more stations before lowering the carrier rings 200 (where at least one of the carrier rings supports a wafer 101) to a next location so that further plasma processing, treatment and/or film deposition can take place on respective wafers 101.

Figure 3:
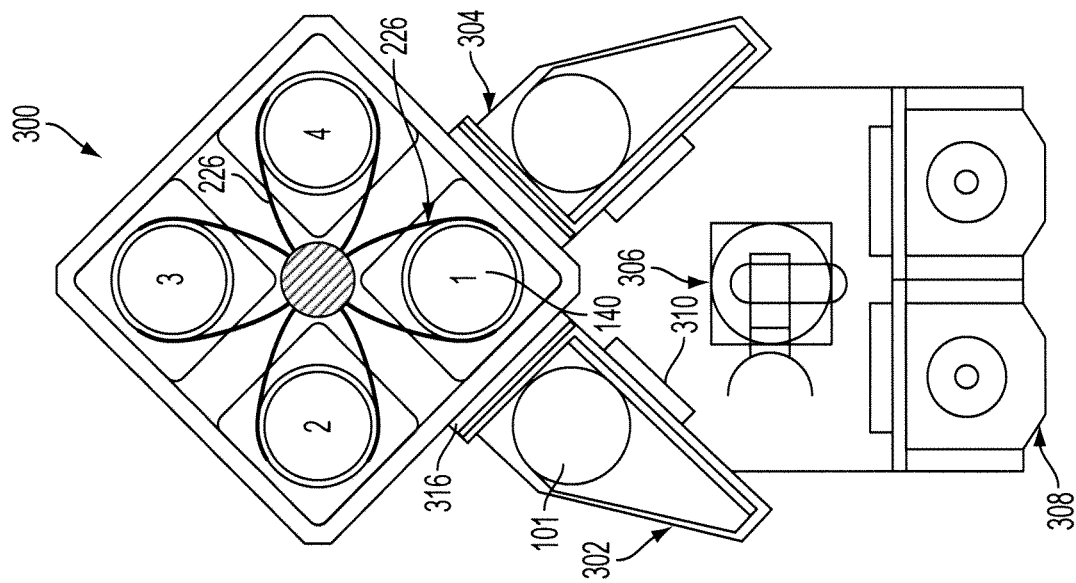
FIG. 3 shows a schematic view of a multi-station processing tool with an inbound load lock and an outbound load lock, in accordance with various embodiments described in the present disclosure.

FIG. 3 shows a schematic view of an embodiment of a multi-station processing tool 300 with an inbound load lock 302 and an outbound load lock 304. A robot 306, at atmospheric pressure, is configured to move substrates, e.g., the wafer 101, etc., from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with the lower chamber portion 102b. Thus, when the chamber transport 316 is open, another robot (not shown) may move the substrate from the inbound load lock 302 to the pedestal 140 of a first process station for processing.

The depicted lower chamber portion 102b has four process stations, numbered from 1 to 4 in the embodiment shown in FIG. 3. In some embodiments, the lower chamber portion 102b maintains a low pressure environment so that substrates may be transferred using a carrier ring 200 among the process stations without experiencing a vacuum break and/or air exposure. Each process station depicted in FIG. 3 includes a process station substrate holder and process gas delivery line inlets.

FIG. 3 also depicts spider forks 226 for transferring substrates within the lower chamber portion 102b. As will be described in more detail below, the spider forks 226 rotate and enable transfer of wafers 101 from one station to another. The transfer occurs by enabling the spider forks 226 to lift carrier rings 200 from an outer undersurface, which lifts the wafer 101, and rotates the wafer 101 and carrier ring 200 together to the next station. In one configuration, the spider forks 226 are made from a ceramic material to withstand high levels of heat during processing.

Figure 4:
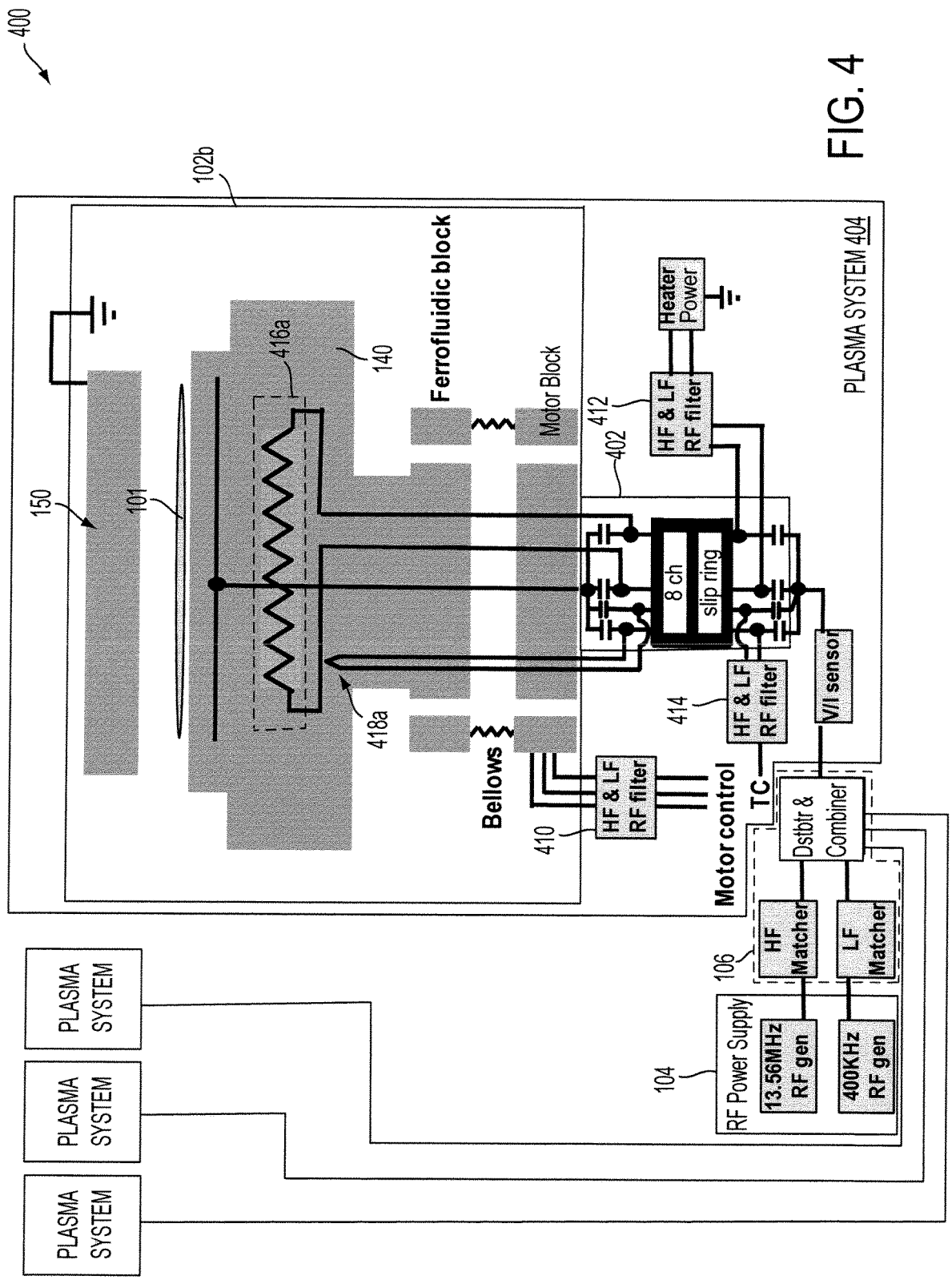
FIG. 4 is a diagram of a processing system for illustrating use of an isolation system for isolating alternating current (AC) or direct current (DC) signals from mixed radio frequency (RF) signals, in accordance with several embodiments described in the present disclosure.

FIG. 4 is a diagram of an embodiment of a processing system 400 for illustrating use of an isolation system 402 for isolating AC or DC signals from mixed RF signals. The processing system 400 includes a plasma system 404 and additional plasma systems, which are similar to the plasma system 404. The plasma system 404 further includes the RF power supply 104, the match network 106, and a power distributor and combiner, labeled as "Dstbtr & Combiner" in FIG. 4.

The RF power supply 104 includes a 13.56 megahertz (MHz) RF generator and a 400 kilohertz (kHz) RF generator. The match network 106 includes a high radio frequency impedance matching circuit and a low radio frequency impedance matching circuit. The plasma system 404 includes a voltage or current sensor (V/I sensor), a temperature controller (TC), the lower chamber portion 102b, the isolation system 402, multiple high frequency (HF) and low frequency (LF) filters 410, 412, and 414, an AC power source for heater, an AC power source for motor. Each of the filters 410, 412, and 414 are further described in a U.S. patent application Ser. No. 14/884,401, filed on Oct. 15, 2015, and titled "Mutually Induced Filters", which is incorporated by reference herein in its entirety. The AC power source for heater is labeled as "Heater Power", the temperature controller is labeled as "TC", and the AC power source for motor is labeled as "Motor control" in FIG. 4.

The pedestal 140 includes a heater element 416a, e.g., a resistor, a plate, etc., that is used to heat the pedestal 140 to control, e.g., increase, decrease, etc., temperature of plasma formed in a gap between the showerhead 150 and the pedestal 140. A thermocouple 418a is in proximity to the heater element 416a. For example, the thermocouple 418a is placed within a pre-determined distance from the heater element 416 to sense a temperature of the heater element 416a. As another example, the thermocouple 418a is placed in contact with the heater element 416a to sense the temperature of the heater element 416a.

The isolation system 402 includes a slip ring that is connected at an end to a top plate, e.g., a printed circuit board, a top interface, etc., of the isolation system 402 and at another end to a bottom plate, e.g., a printed circuit board, a bottom interface, etc., of the isolation system 402. Both the top and bottom plates are further described below. A bottom portion of the slip ring is fixed and a top portion of the slip ring is rotatable. The top portion is located closer to the pedestal 140 compared to the bottom portion of the slip ring. In some embodiments, a liquid metal, e.g., mercury, etc., is bonded to contacts of the top and bottom portions of the slip ring. The use of the liquid metal between the bottom and top portions of the slip ring provides electrical connection between the bottom and top portions. When the liquid metal is used, the slip ring is referred to herein as a wetted slip ring. In various embodiments, the slip ring includes a sliding brush contact instead of the liquid metal contact. Each of the top and bottom plates of the isolation system has capacitors affixed thereto.

The AC power source for motor supplies an AC signal via the filter 410 to the motor. When a stator of the motor is provided with the AC signal, a rotor of the motor rotates to rotate the pedestal 140. The motor is connected to the pedestal 140 via one or more connection mechanisms, e.g., gears, rods, shafts, links, bellows, ferrofluidic blocks, etc., to the pedestal 140. The rotation of the pedestal 140 rotates the wafer 101 that is placed on the pedestal 140 during processing of the wafer 101, e.g., deposition of materials on the wafer 101, cleaning of the wafer 101, etc.

Each RF generator of the RF power supply 104 supplies an RF signal via a corresponding RF cable to a corresponding match circuit of the match network 106. A high radio frequency match circuit of the match network 106 receives an RF signal from the 13.56 MHz RF generator to generate a high frequency RF signal and a low radio frequency match circuit of the match network 106 receives an RF signal from the 400 kHz RF generator to generate a low frequency RF signal. The power distributor and combiner receives the high and low frequency RF signals from the high radio frequency match circuit and the low frequency match circuit to combine the RF signals to further generate a modified RF signal. The high radio frequency match circuit and the low frequency match circuit receive the RF signals from the RF power supply 104 and match an impedance of a load connected to the match network 106 with that of a source connected to the match network 106 to generate the modified RF signal by the match network 106 from the RF signals received from the RF power supply 104. For example, the match network 106 matches a combined impedance of the lower chamber portion 102b and the isolation system 402 with that of the RF power supply 104. The modified RF signal is distributed by the power distributor and combiner among the plasma system 404 and the additional plasma systems.

A portion of the modified RF signal is supplied to the isolation system 402. Moreover, the isolation system 402 receives an AC signal via the filter 412 from the AC power source for heater. The AC power source for heater generates an AC signal for providing AC power to the heater element 416a. The isolation system 402 blocks AC power of the AC signal received via the filter 412 to reduce chances of the AC power from being provided to the RF power supply 104 via the match network 106 and to reduce chances of the AC power from being provided to the lower electrode of the pedestal 140. Moreover, the isolation system 402 combines the AC signal received via the filter 412 with the portion of the modified RF signal to generate a combined signal. The isolation system 412 blocks AC power from the combined signal to generate an RF signal, which is supplied to the lower electrode of the pedestal 140 for processing of the wafer 101.

In addition, the isolation system 412 provides a portion of the combined signal to the heater element 416a to control a temperature of the heater element 416a. The portion of the combined signal passes through the heater element 416a to generate a return signal. The return signal has AC power and RF power. The return signal is provided from the heater element 416a to the isolation system 402. The return signal is combined with a portion of the modified RF signal to generate a supply signal. The isolation system 402 blocks AC power from the supply signal to reduce a probability of the AC power adversely affecting the RF power supply 104 via the match network 106 and to reduce a probability of the AC power affecting the lower electrode of the pedestal 140. The isolation system 412 blocks AC power from the supply signal to generate an RF signal, which is supplied to the lower electrode of the pedestal 140 for processing of the wafer 101. RF power from the supply signal is filtered by the filter 412 so that the RF power does not cause damage to the AC power source for heater.

The thermocouple 418a senses temperature of the heater element 418a to generate sensed temperature signals, e.g., DC signals, etc. A first one of the sensed temperature signals is provided from a first wire of the thermocouple 418a to the isolation system 402. The first sensed temperature signal is combined with a portion of the modified RF signal received by the isolation system 402 from the match network 106 to generate a combination signal. DC power from the combination signal is blocked by the isolation system 402 to reduce possibilities of adverse impact by the DC power on the RF power supply 104 via the match network 104 and to reduce possibilities of adverse impact by the DC power on the lower electrode of the pedestal 140. The isolation system 412 blocks DC power from the combination signal to provide an RF signal, which is supplied to the lower electrode of the pedestal 140 for processing of the wafer 101. Furthermore, RF power from a portion of the combination signal passes via the first wire of the thermocouple 418a and a thermocouple junction of the thermocouple 418a to a second wire of the thermocouple 418a. The RF power is combined with a second one of the sensed temperature signals at the thermocouple junction to generate an output signal. The output signal is provided via the second wire of the thermocouple 418a to the isolation system 402. The isolation system 402 combines the output signal with a portion of the modified signal received from the match network 106 to generate a summed signal. The isolation system 402 blocks DC power from the summed signal to reduce chances of adverse effect of the DC power on the RF power supply 104 via the match network 104 and to reduce chances of adverse effect by the DC power on the lower electrode of the pedestal 140. The isolation system 412 blocks DC power from the summed signal to provide an RF signal, which is supplied to the lower electrode of the pedestal 140 for processing of the wafer 101. RF power from the summed signal is filtered by the filter 414 so that the RF power does not adversely affect the temperature controller.

In some embodiments, the system 400 includes any number of plasma systems. For example, the system 400 includes the plasma system 404 and includes two additional plasma systems.

In various embodiments, instead of the 13.56 MHz RF generator, an RF generator that has another operational frequency is used. For example, any other MHz RF generator is used instead of the 13.56 MHz RF generator. Similarly, in some embodiments, instead of the 400 kHz RF generator, an RF generator that has another operational frequency is used. For example, any other kHz RF generator or a MHz RF generator is used instead of the 400 kHz RF generator.

In several embodiments, the RF power supply 104 includes a low radio frequency RF generator and a high radio frequency RF generator. An operational frequency of the high RF generator is greater than an operational frequency of the low RF generator.

In some embodiments, the RF power supply 104 includes any number of RF generators. For example, the RF power supply 104 includes a kHz RF generator, a MHz RF generator, and an additional MHz RF generator. In this example, the match network 106 includes an additional high frequency impedance matching circuit that is connected to the additional MHz RF generator at one end via an RF cable and to the power distributor and combiner at another end. The power distributor and combiner combines RF signals received from all the three RF generators.

In various embodiments, the plasma system 404 does not include the voltage or current sensor. For example, the power distributor and combiner is connected to the isolation system 402 without being coupled to the voltage or current sensor.

In some embodiments, instead of the voltage or current sensor, a current and voltage sensor is used to sense a complex voltage and current of the modified RF signal provided to the isolation system 402 from the power distributor and combiner.

In various embodiments, instead of the AC signal being supplied to a heater element from an AC power supply, a DC signal is supplied to the heater element from a DC power supply, and the above-described methods apply to the DC signal in the same manner in which the methods are applies to the AC signal. For example, the DC signal is combined with the portion of the modified RF signal in the isolation system 402 and RF power from the DC signal is filtered by the isolation system 402.

In some embodiments, the AC power source operates at a frequency that ranges between 10 hertz (Hz) and 240 Hz. In several embodiments, the AC power source operates at a frequency that ranges between 20 Hz and 120 Hz. In various embodiments, the AC power source operates at a frequency of 60 Hz. In some embodiments, the AC power source operates at a frequency of 50 Hz. The frequency of operation of the AC power source varies based on frequency specifications of electrical power of a country, e.g., Europe, USA, etc., in which the AC power source is implemented. The frequency specifications are published by the International Electrotechnical Commission (IEC).

Figure 5A:
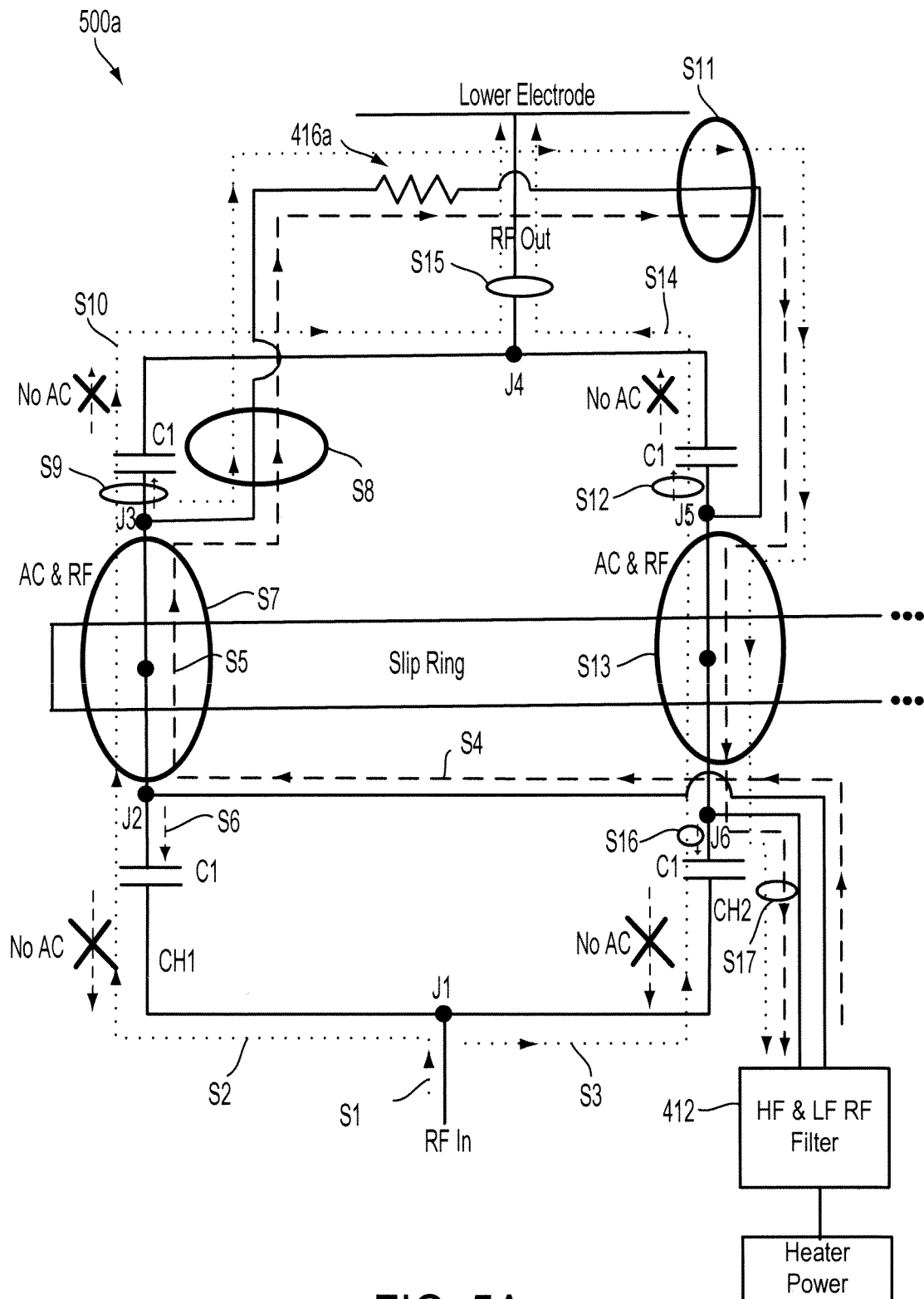
FIG. 5A is a diagram of a circuit to illustrate blocking of AC power from a mixed RF signal by the circuit, in accordance with some embodiments described in the present disclosure.

FIG. 5A is a diagram of an embodiment of a circuit 500*a* to illustrate blocking of AC power by the circuit 500*a*, which is a portion of the isolation system 402 (FIG. 4) that is connected to the AC power source for heater via the filter 412. A signal S1, which is the modified RF signal received from the match network 106 (FIG. 4), is received at an RF input, e.g., a wire, etc., of the isolation system 402. The signal S1 is split into RF signals S2 and S3 at a junction J1 of a channel CH1 and of a channel CH2. In some embodiments, the term channel and channel path are used interchangeably herein. An AC signal S4, which is output from the filter 412, is split into two AC signals S5 and S6 at a junction J2 of the channel CH1. The signal S6 passes through a bottom capacitor C1 of the channel CH1 and is blocked by the bottom capacitor C1 to reduce chances of AC power of the signal S6 from reaching the RF power supply 104 via the match network 106 and from damaging components of the RF power supply 104. The RF signal S2 passes through the bottom capacitor C1 of the channel CH1 and is combined with the signal S5 to provide a signal S7, which has both AC power and RF power.

The combined signal S7 is split into signals S8 and S9 at a junction J3 of the channel CH1. Each signal S8 and S9 has AC power and RF power. A top capacitor C1 of the channel CH1 blocks the AC power from the signal S9 to provide an RF signal S10, which has a minimal amount of AC power, e.g., zero AC power, or negligible AC power, etc. The blocking by the top capacitor C1 of the channel CH1 reduces chances of AC power of the signal S9 from damaging the lower electrode of the pedestal 140. The RF signal S10 is transferred to a junction J4 of the channel CH1. The junction J4 is connected to an RF output of the isolation system 402.

The signal S8 passes through the heater element 416*a* to change a temperature of the gap between the showerhead 150 and the pedestal 140. The passage of the signal S8 through the heater element 416*a* results in a signal S11 being output from the heater element 416*a*. The signal S11 has both AC power and RF power. The signal S11 is split into two signals S12 and S13 at a junction J5 of the channel CH2 of the circuit 500*a*. Each signal S12 and S13 has both AC power and RF power. A top capacitor C1 of the channel CH2 blocks the AC power from the signal S12 to provide an RF signal S14, which has a minimal amount of AC power. The RF signal S14 is combined at the junction J4 with the signal S10 received from the channel CH1 and with a portion of the signal S3 received via the channel CH2 to generate an RF signal S15, which is provided via an RF output, e.g., an RF cable, etc., to the lower electrode of the pedestal 140. The blocking of the AC power from the signal S12 protects the lower electrode from being damaged by the AC power.

The signal S13 splits into signals S16 and S17 at a junction J6 of the channel CH2. Each signal S16 and S17 has both RF and AC power. A bottom capacitor C1 of the channel CH2 blocks the AC power from the signal S16 to decrease chances of the AC power from reaching the RF power supply 104 via the match network 106 and damaging components of the RF power supply 104. The filter 412 filters RF power from the signal S17 to prevent damage to components of the AC power source for heater.

In some embodiments in which instead of the AC power source for heater, a DC power source for heater is used, the above circuit 500*a* applies equally to the DC power source for heater such that DC power is blocked by the circuit 500*a* instead of AC power. Moreover, DC power is combined with RF power by the circuit 500*a* instead of combining AC power with RF power.

Figure 5B:
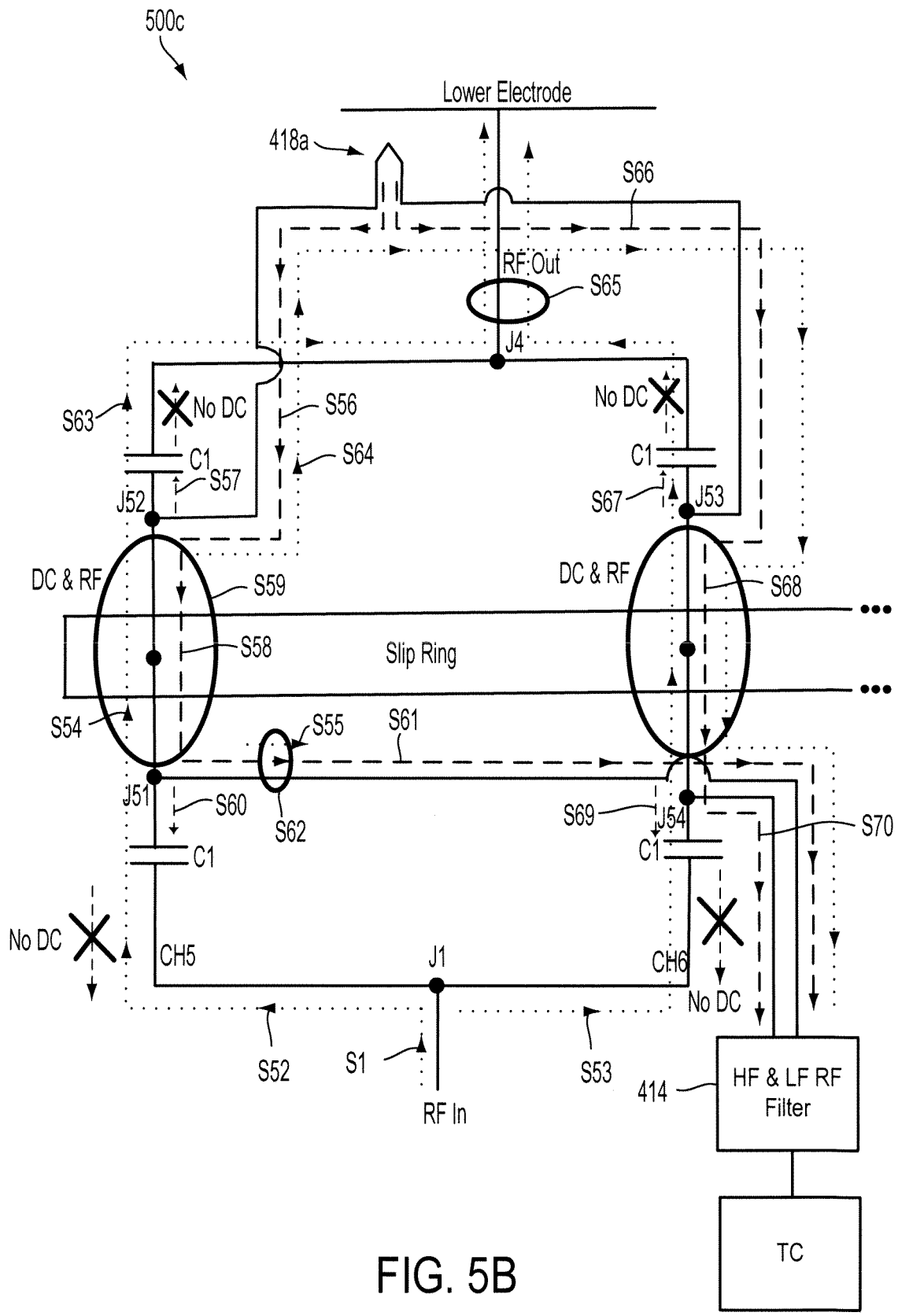
FIG. 5B is a diagram of a circuit to illustrate blocking of DC power from a mixed RF signal by the circuit, in accordance with some embodiments described in the present disclosure.

FIG. 5B is a diagram of an embodiment of a circuit 500*c* to illustrate blocking of DC power by the circuit 500*c*, which is a portion of the isolation system 402 (FIG. 4) that is connected to the temperature controller via the filter 414. The signal S1, which is the modified RF signal received from the match network 106 (FIG. 4), is received at the RF input of the isolation system 402. The signal SM is split into RF signals S52 and S53 at the junction J1 of a channel CH5 and of a channel CH6. The signal S52 is further split into RF signals S54 and S55 at a junction J51 of the channel CH5. A DC signal S56, which is a voltage signal, is generated by the thermocouple 418*a*, is split into two DC signals S57 and S58 at a junction J52 of the channel C5. The signal S57 passes through a top capacitor C1 of the channel CH5 and is blocked by the top capacitor C1 to reduce chances of DC power of the signal S57 from reaching the lower electrode of the pedestal 140 via the RF output and from damaging the lower electrode. The signal S58 passes through the channel CH5 and combines with the signal S54 to provide a combined signal S59, which has both DC power and RF power.

The combined signal S59 is split into signals S60 and S61 at the junction J51 of the channel CH5. Each signal S60 and S61 has DC power and RF power. A bottom capacitor C1 of the channel CH5 blocks the DC power from the signal S60. The blocking by the bottom capacitor C1 of the channel CH5 reduces chances of DC power of the signal S60 from reaching the RF power supply 104 via the match network 106 and from damaging the RF power supply 104. The signal S61 combines with the signal S55 to generate a combined signal S62, which is sent to the filter 414 from the circuit 500c. The combined signal S62 has both DC and RF power. The filter 414 filters the RF power from the combined signal S62 and provides the DC power of the signal S62 to the temperature controller.

The signal S59 is split at the junction J52 into signals S63 and S64. Each signal S63 and S64 has RF power. The signal S63 passes via the capacitor C1 to the RF output. A portion of the signal S53 combines with the signal S63 at the junction J4 of the channels CH5 and CH6 to generate a signal S65, which is sent to the lower electrode of the pedestal 140 for processing the wafer 101. Moreover, a portion of the signal S64 passes via a thermocouple junction of the thermocouple 418a, a junction J53 of the channel C6 of the circuit 500c, and a junction J54 of the channel CH6 to be filtered by the filter 414 so that the portion does not cause damage to the temperature controller. A DC signal S66 is a voltage signal that is generated when the thermocouple 418a measures the temperature of the heater element 416a (FIG. 5A). For example, the DC signal S66 has a polarity opposite to a polarity of the DC signal S56. The DC signal S66 from the thermocouple 418a is split into DC signals S67 and S68 at the junction J53. DC power from the signal S67 is blocked by a top capacitor C1 of the channel CH6 to reduce possibilities of the DC power from reaching the lower electrode via the RF output and causing damage to the lower electrode.

The DC signal S68 is further split into two DC signals S69 and S70 at the junction J54 of the channel CH6. DC power from the signal S69 is blocked by a bottom capacitor C1 of the channel CH6 to decrease a probability of DC power of the signal S69 from reaching the RF power supply 104 via the match network 106 and damaging components of the RF power supply 104. DC power from the signal S70 passes via the filter 414 to the temperature controller. The temperature controller receives DC power from the signals S61 and S70 to determine the temperature measured by the thermocouple 418a. The temperature controller is connected to the AC power source for heater to control the AC power source for heater. For example, the temperature controller determines whether the temperature measured by the thermocouple 418a is greater than a pre-determined threshold. Upon determining that the temperature measured by the thermocouple 418a is greater than the pre-determined threshold, the temperature controller sends a command to the AC power source for heater to decrease an amount of power provided to the heater element 416a to further reduce temperature within the gap between the showerhead 150 and the pedestal 140. On the other hand, upon determining that the temperature measured by the thermocouple 418a is less than the pre-determined threshold, the temperature controller sends a command to the AC power source for heater to increase an amount of power provided to the heater element 416a to further increase temperature within the gap. The filter 414 filters RF power from the signals S61 and S70 to prevent the RF power from reaching the temperature controller to further prevent damage to components of the temperature controller.

It should be noted that although the above-referenced embodiment of circuit 500c is described with reference to DC signals, the embodiment applies equally to AC signals. For example, instead of blocking DC power from a signal that includes both DC and RF power, the circuit 500c is used to block AC signals from a signal that includes both AC and RF power. Moreover, the circuit 500c combines RF power with AC power instead of combining DC power with RF power.

In some embodiments, the capacitor C1, of the circuit 500a (FIG. 5A) and/or of the circuit 500c, has a high impedance at a low frequency, e.g., 60 Hertz, etc., and a low impedance at a high frequency, e.g., 400 kilohertz, 13.56 megahertz, etc. For example, the capacitor C1 does not allow passage of AC or DC signals having the low frequency and allows passage of an RF signal having the high frequency.

In various embodiments, a value of capacitance of each of the bottom and top capacitors C1, of the circuit 500a and/or of the circuit 500c, is the same. For example, a value of capacitance of the capacitor C1 is in an order of nanofarads or in a range of microfarads and is based on plasma impedance. To further illustrate, a value of a capacitance of the capacitor C1 is 60 nanofarads for 10 ohm plasma impedance. As another illustration, a value of a capacitance of the capacitor C1 ranges between 10 nanofarads to 100 microfarads. As another illustration, a value of a capacitance of the capacitor C1 ranges between 30 nanofarads to 100 nanofarads.

Figure 5C:
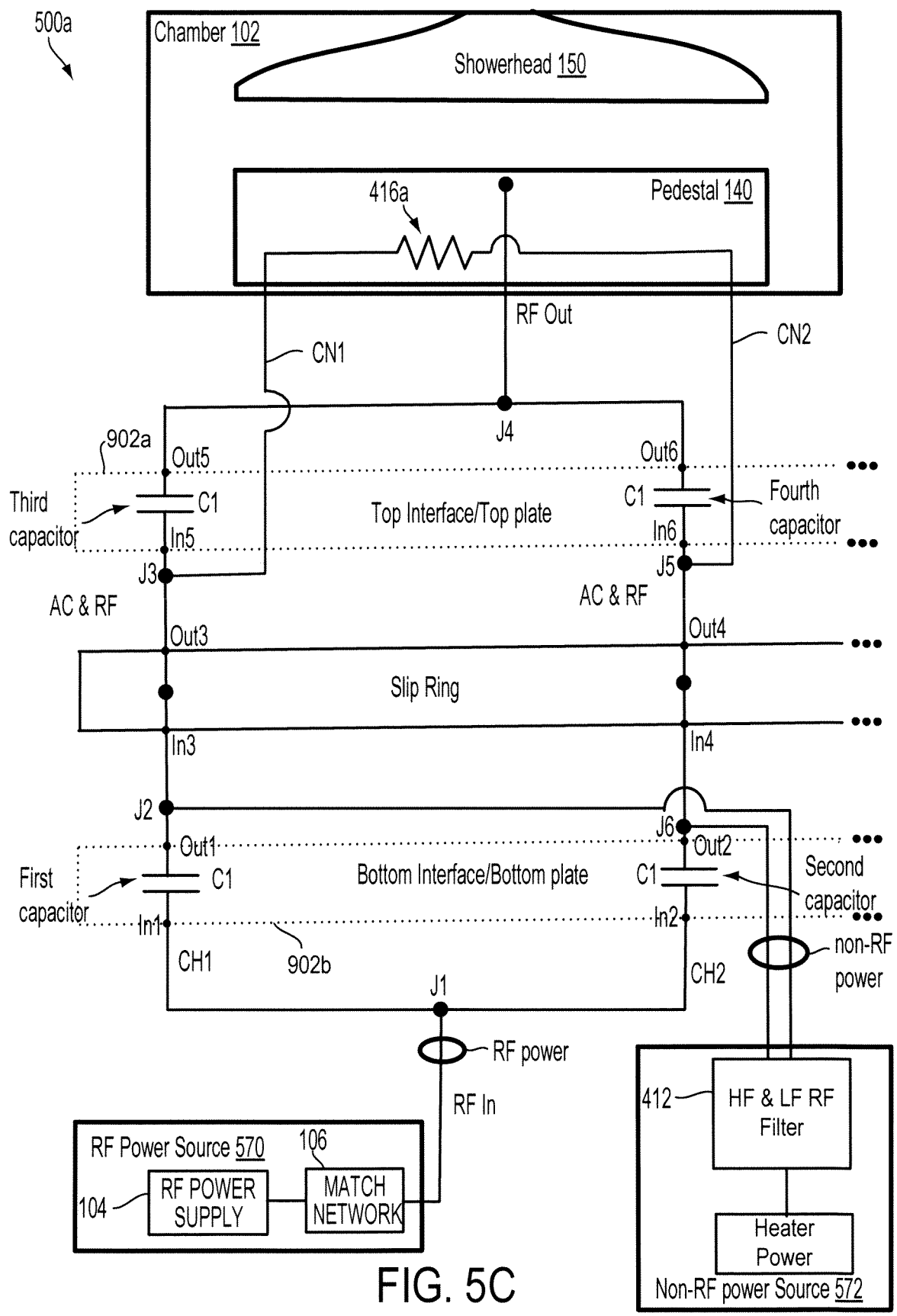
FIG. 5C is a diagram of an embodiment of the circuit of FIG. 5A to illustrate connections between various parts of the circuit.

FIG. 5C is a diagram of an embodiment of the circuit 500a to illustrate connections between various parts of the circuit 500a. The circuit 500a includes a bottom interface, e.g., a bottom plate 902b, etc., having a first capacitor C1 of the channel CH1 and a second capacitor C1 of the channel CH2. The first capacitor C1 has an input In1 and an output Out1. Moreover, the second capacitor C1 has an input In2 and an output Out2. The RF power supply 104 for heater is coupled to the input In1 of the first capacitor C1 via the match network 106 and to the input In2 of the second capacitor C2 via the match network 106 and the junction J1. The RF power supply 104 and the match network 106 are collectively labeled as an RF power source 570. Moreover, AC power source for heater, which is an example of a non-RF power source, is coupled to the output Out1 of the first capacitor C1 via the filter 412 and the junction J2 and to the output Out2 of the second capacitor C2 via the filter 412 and the junction J6. The AC power source for heater and the filter 412 are collectively labeled to be a non-RF power source 572. The circuit 500a includes the slip ring that has inputs In3 and In4 and outputs Out3 and Out4. The input In3 of the slip ring is connected to the output Out1 of the first capacitor C1 and the input In4 of the slip ring is connected to the output Out2 of the second capacitor C2. The circuit 500a has a top interface, e.g., a top plate 902a, etc., having a third capacitor C1 of the channel CH1 and a fourth capacitor C1 of the channel CH2. The third capacitor C1 has an input In5 and an output Out5, and the fourth capacitor C1 has an input In6 and an output Out6. The input In5 of the third capacitor C1 is connected to the output Out3 of the slip ring and the input In6 of the fourth capacitor C1 is connected to the output Out4 of the slip ring. Moreover, the input In5 of the third capacitor C1 is connected to a first heater connection CN1 via the junction J3 and the input In6 of the fourth capacitor C1 is connected to a second heater connection CN2 via the junction J5. The heater connections CN1 and CN2 are connected to the heater element 416a. Moreover, the output Out5 of the third capacitor and the output Out6 of the fourth capacitor are connected via the junction J4 to the lower electrode of the pedestal 140. RF power that is generated by the RF power supply 104 is communicated through the first and second capacitors, the slip ring, and the third and fourth capacitors to the lower electrode. Moreover, non-RF power, e.g., AC power, etc., that is generated by the AC power source for heater is communicated through the slip ring located between the top interface and the bottom interface to the heater element 416a.

In some embodiments in which a DC power source is used for supplying DC power to the heater element 416a, the DC power is communicated through the slip ring located between the top interface and the bottom interface to the heater element 416a. The DC power is an example of the non-RF power.

Figure 5D:
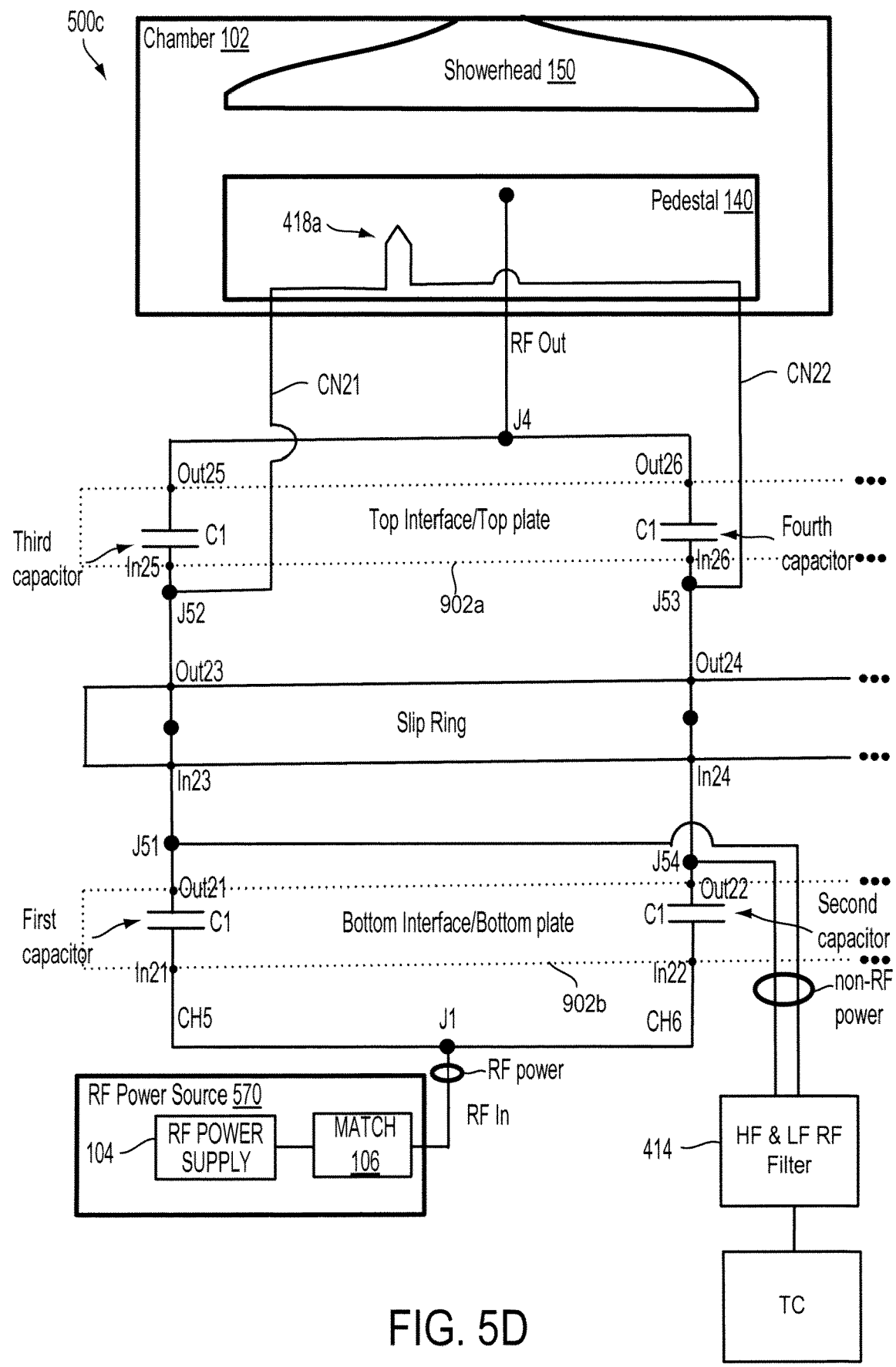
FIG. 5D is a diagram of an embodiment of the circuit of FIG. 5B to illustrate connections between various parts of the circuit.

FIG. 5D is a diagram of an embodiment of the circuit 500c to illustrate connections between various parts of the circuit 500c. The circuit 500c includes the bottom interface having a first capacitor C1 of the channel CH5 and a second capacitor C1 of the channel CH6. The first capacitor C1 has an input In21 and an output Out21. Moreover, the second capacitor C1 has an input In22 and an output Out22. The RF power supply 104 for heater is coupled to the input In21 of the first capacitor C1 via the match network 106 and the junction J1 and to the input In22 of the second capacitor C2 via the match network 106 and the junction J1. Moreover, the temperature controller is coupled to the output Out21 of the first capacitor C1 via the filter 414 and the junction J51 and to the output Out22 of the second capacitor C2 via the filter 414 and the junction J54. The circuit 500b includes the slip ring that has inputs In23 and In24 and outputs Out23 and Out24. The input In23 of the slip ring is connected to the output Out21 of the first capacitor C1 and the input In24 of the slip ring is connected to the output Out22 of the second capacitor C2. The circuit 500c has the top interface having a third capacitor C1 of the channel CH5 and a fourth capacitor C1 of the channel CH6. The third capacitor C1 has an input In25 and an output Out25, and the fourth capacitor C1 has an input In26 and an output Out26. The input In25 of the third capacitor C1 is connected to the output Out23 of the slip ring and the input In26 of the fourth capacitor C1 is connected to the output Out24 of the slip ring. Moreover, the input In25 of the third capacitor C1 is connected to a first thermocouple connection CN21, e.g., a first thermocouple wire, etc., via the junction J52 and the input In26 of the fourth capacitor C1 is connected to a second thermocouple connection CN22, e.g., a second thermocouple wire, etc., via the junction J53. The thermocouple connections CN21 and CN22 are connected to the thermocouple junction of the thermocouple 418a. Moreover, the output Out25 of the third capacitor and the output Out26 of the fourth capacitor are connected via the junction J4 to the lower electrode of the pedestal 140. RF power that is generated by the RF power supply 104 is communicated through the first and second capacitors, the slip ring, and the third and fourth capacitors to the lower electrode. Moreover, signals generated by the thermocouple 418a by sensing temperature of the heater 416a are communicated through the slip ring located between the top interface and the bottom interface to the filter 414.

Figure 6:
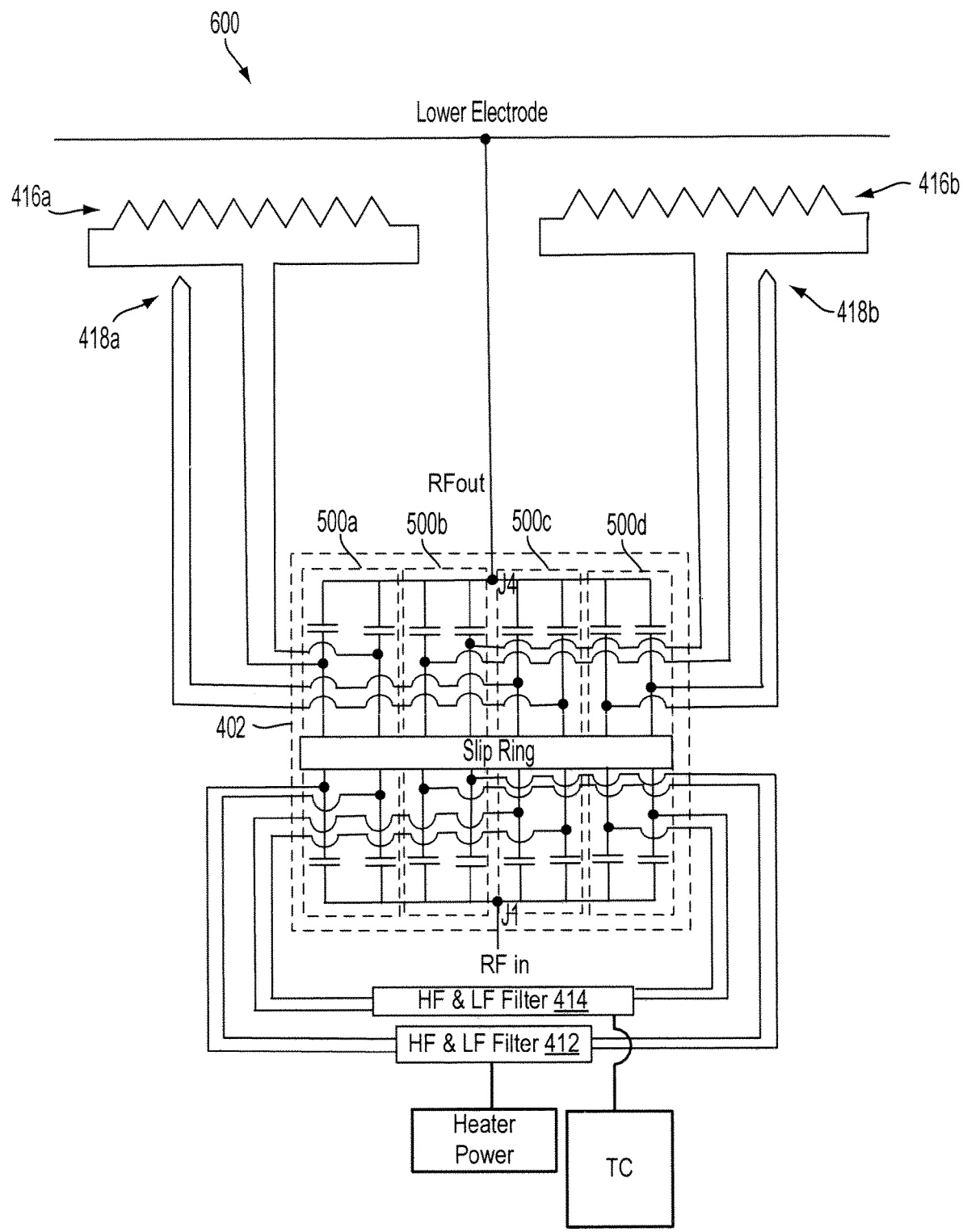
FIG. 6 is a diagram of a system for illustrating use of the isolation system with multiple heater elements of a pedestal and with multiple thermocouples, in accordance with several embodiments described in the present disclosure.

FIG. 6 is a diagram of an embodiment of a system 600 for illustrating use of the isolation system 402 with multiple heater elements, e.g., the heater element 416a, a heater element 416b, etc., of the pedestal 140 and with multiple thermocouples, e.g., the thermocouple 416a, a thermocouple 416b, etc. The heater elements 416a and 416b control temperature in different zones within the gap between the showerhead 150 (FIG. 1) and the pedestal 140 (FIG. 1). The heater element 416b is the same as the heater element 416a. For example, the heater element 416b is operated to heat a portion of a component, e.g., an electrode, the lower electrode, etc., located within the pedestal 140 to control temperature of processing the wafer 101 (FIG. 1) and the heater element 416a is operated to heat another portion of the component located within the pedestal 402. A thermocouple 418b is in proximity to the heater element 416b to sense a temperature of the heater element 416b in the same manner that the thermocouple 418a is in proximity to the heater element 416a.

The heater element 416b is connected to a circuit 500b of the isolation system 402 in the same manner in which the heater element 416a is connected to the circuit 500a of the isolation system 402. The circuit 500b is connected to the AC power source for heater via the filter 412. The circuit 500b includes channels, CH3 and CH4, shown in FIG. 7A below. The channels CH3 and CH4 of the circuit 500b are similar in structure and functionality to the channels CH1 and CH2 of the circuit 500a. For example, blocking illustrated in FIG. 5A is performed by the circuit 500b. As another example, the circuit 500a is an example of the circuit 500b when the circuit 500a is connected to the heater element 416b instead of the heater element 416a. Each channel of the circuit 500b has a top capacitor C1 to block AC power to protect the lower electrode of the pedestal 140 from being damaged in the same manner in which the top capacitor C1 of each channel of the circuit 500a protects the lower electrode. Also, each channel of the circuit 500b has a bottom capacitor C1 to block AC power and reduces chances of the AC power from reaching the RF power supply 104 (FIG. 1) via the match network 106 (FIG. 1) to protect the RF power supply 104 from being damaged. Each of the circuits 500a and 500b is connected to the RF input via the junction J1 at one end and to the RF output via the junction J4 at another end.

Moreover, the thermocouple 418b is connected to a circuit 500d of the isolation system 402 in the same manner in which the thermocouple 418a is connected to the circuit 500c of the isolation system 402. The circuit 500d is connected to the temperature controller via the filter 414. The circuit 500d includes channels, CH7 and CH8, shown in FIG. 7A below. The channels CH7 and CH8 of the circuit 500d are similar in structure and functionality to the channels CH5 and CH6 of the circuit 500c. For example, blocking illustrated in FIG. 5B is performed by the circuit 500d. As another example, the circuit 500c is an example of the circuit 500d when the circuit 500c is connected to the thermocouple 418b instead of the thermocouple 418a. Each channel of the circuit 500c has a top capacitor C1 to block DC power to protect the lower electrode of the pedestal 140 from being damaged in the same manner in which the top capacitor C1 of each channel of the circuit 500c protects the lower electrode. Also, each channel of the circuit 500d has a bottom capacitor C1 to block DC power and reduces chances of the DC power from reaching the RF power supply 104 (FIG. 1) via the match network 106 (FIG. 1) to protect the RF power supply 104 from being damaged. Each of the circuits 500c and 500d is connected to the RF input via the junction J1 at one end and to the RF output via the junction J4 at another end.

It should be noted that in some embodiments, the system 600 includes any number of heater elements and any number of thermocouples. A number of circuits, such as, for example, the circuit 500a and 500b, etc., of the isolation system 402 increases with the number of heater elements. For example, when three heater elements are used in the system 600, three circuits, same as the circuit 500a, are used. Similarly, a number of circuits, such as, for example, the circuit 500c and 500d, etc., of the isolation system 402 increases with the number of thermocouples. For example, when three thermocouples are used in the system 600, three circuits, each of which is the same as the circuit 500c, are used.

In various embodiments, the thermocouple 418b is used for over-temperature detection. For example, when the thermocouple 418a fails, e.g., malfunctions, does not function, etc., the thermocouple 418b measures a temperature of the heater element 416b and the temperature controller determines whether the temperature exceeds a pre-determined temperature. In case the temperature exceeds the pre-determined temperature, the temperature controller controls AC power sources that provide power to the heater elements 416a and 416b to reduce temperature of one or both the heater elements 416a and 416b.

Figure 7A:
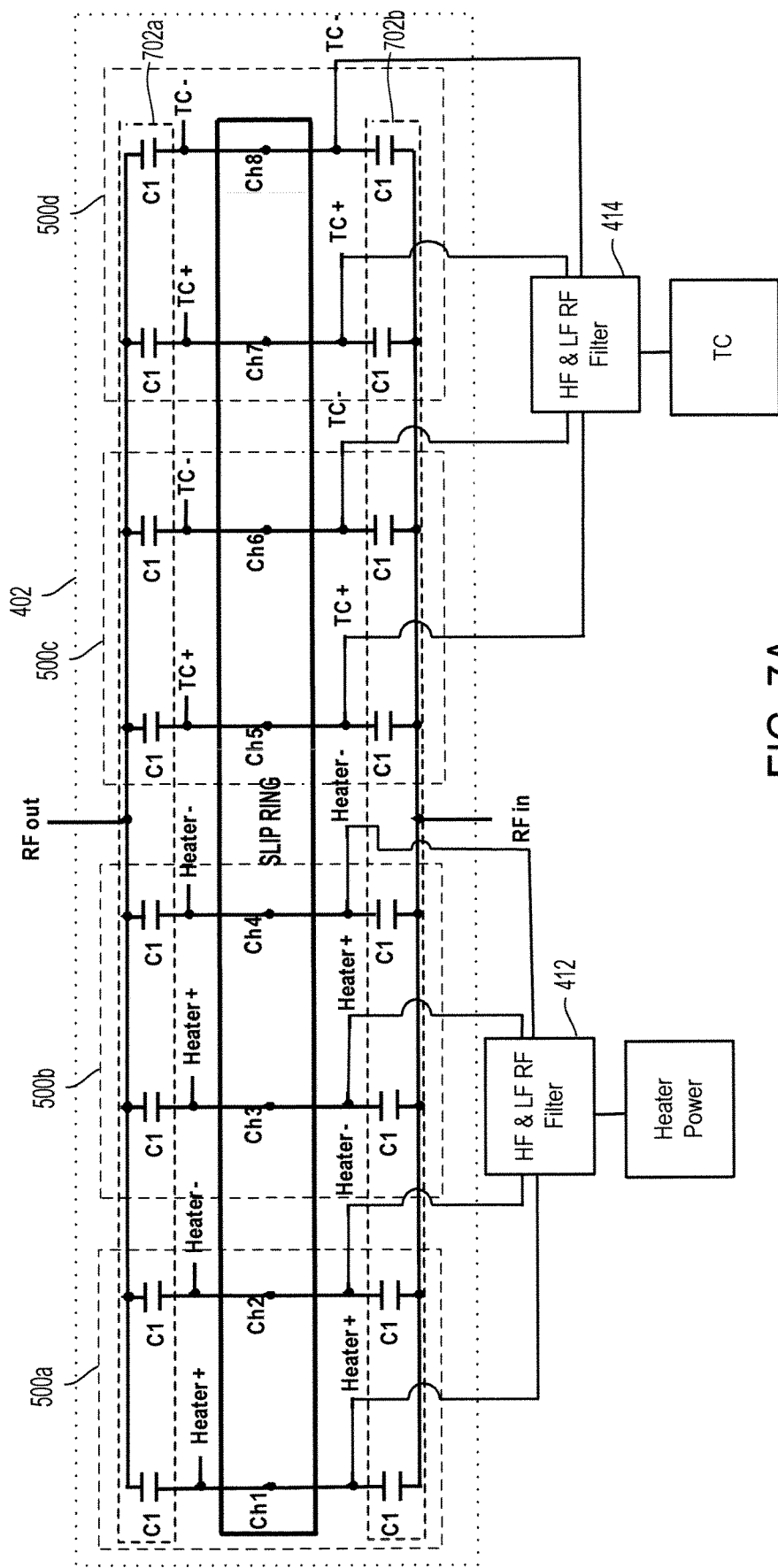
FIG. 7A is a circuit diagram of the isolation system, in accordance with some embodiments described in the present disclosure.

FIG. 7A is a diagram of an embodiment of the isolation system 402. As shown, the isolation system 402 includes the slip ring between a group 702a of top capacitors and a group 702b of bottom capacitors, each of the capacitors being C1. The slip ring connects the group 702a of top capacitors with the group 702b of bottom capacitors. The isolation system 402 includes the circuits 500a, 500b, 500c, and 500d. The circuit 500a is connected to the heater element 416a and the circuit 500b is connected to the heater element 416b. Similarly, the circuit 500c is connected to the thermocouple 418a and the circuit 500d is connected to the thermocouple 418b. Moreover, each of the circuits 500a and 500b is connected to the AC power source for heater via the filter 412 and each of the circuits 500c and 500d is connected to the temperature controller via the filter 414.

The bottom capacitors of the isolation system 402 block DC or AC signals to reduce possibilities of the DC or AC signals from reaching the RF power supply 104 (FIG. 1) via the match network 106 (FIG. 1). Moreover, the top capacitors of the isolation system 402 block DC or AC signals to reduce possibilities of the DC or AC signals from reaching the lower electrode of the pedestal 140 (FIG. 1).

In some embodiments, a gap between two adjacent ones of the channels CH1 thru CH8 is in an order of millimeters, e.g., between 5 to 10 millimeters, between 4 and 8 millimeters, between 5 and 20 millimeters, etc.

It should be noted that when a dedicated RF channel is assigned for transferring only an RF signal to the pedestal 140, a voltage potential on the pedestal 140 is high depending on a process condition. Therefore, there is a risk of voltage breakdown between channels that are dedicated. In some embodiments in which dedicated channels are used, e.g., one dedicated channel used to transfer only an RF signal to the pedestal 140, another channel used to transfer only an AC signal, and yet another dedicated channel used to transfer only a DC signal, etc., a potential difference between adjacent dedicated channels is large. For example, there is a large potential difference between a dedicated RF channel and a dedicated AC or DC channel. This increases a risk of a voltage breakdown between the two adjacent dedicated channels.

In various embodiments, assignment to each of the channels CH1 to CH8 is a consideration. Although there is no or minimal RF potential difference between channels CH1 to CH8, there is, in some applications, a voltage drop from an AC or DC signal. Thus, each of the channels CH1 to CH8 are assigned for transferring each signal, e.g., RF signal, AC signal, DC signal, etc. The assignment of the channels CH1 to CH8 reduces chances of a small DC or AC voltage drop between adjacent ones of the channels CH1 to CH8. For example, by assigning a signal having a highest voltage to the channel CH1 and a signal having a lowest voltage to the channel CH8, the isolation system 402 achieves an AC or DC voltage drop that is evenly distributed among the channels CH1 to CH8. The highest voltage is highest among voltages of all signals assigned to the channels CH1 to CH8 and the lowest voltage is lowest among voltages of all signals assigned to the channels CH1 to CH8. By assigning the signals, e.g., RF signal, AC signal, DC signal, etc., to the channels CH1 to CH8 in a rank from the highest voltage to the lowest voltage, a risk of arcing or other permanent electrical damage to the pedestal 140 or other components, e.g., the resistor 416a, the resistor 416b, the thermocouple 418a, the thermocouple 418b, the filter 412, the AC power source, the filter 414, the temperature controller, the match network 106, the RF power supply 104, etc., is minimized.

In various embodiments, amounts of voltages assigned to the channels from CH1 to CH8 are gradually decreasing from the channel CH1 thru CH8. For example, the channels CH1 and CH2 are assigned to a voltage of A volts, the channels CH3 and CH4 are assigned to a voltage of B volts, the channels CH5 and CH6 are assigned to a voltage of C volts, and the channels CH7 and CH8 are assigned to a voltage of D volts, where A is greater than B, which is greater than C, which is greater than D. To further illustrate, the AC power source for heater provides the voltage of A volts to the channels CH1 and CH2 via the filter 412 and provides the voltage of B volts to the channels CH3 and CH4 via the filter 412. Moreover, a thermocouple connected to the channels CH5 and CH6 generates the voltage of C volts and a thermocouple connected to the channels CH7 and CH8 generates the voltage of D volts. There are less chances of arcing from AC or DC power between two adjacent ones of the channels CH1 to CH8 when there is a gradual decrease of voltage among the channels CH1 thru CH8.

Figure 7B:
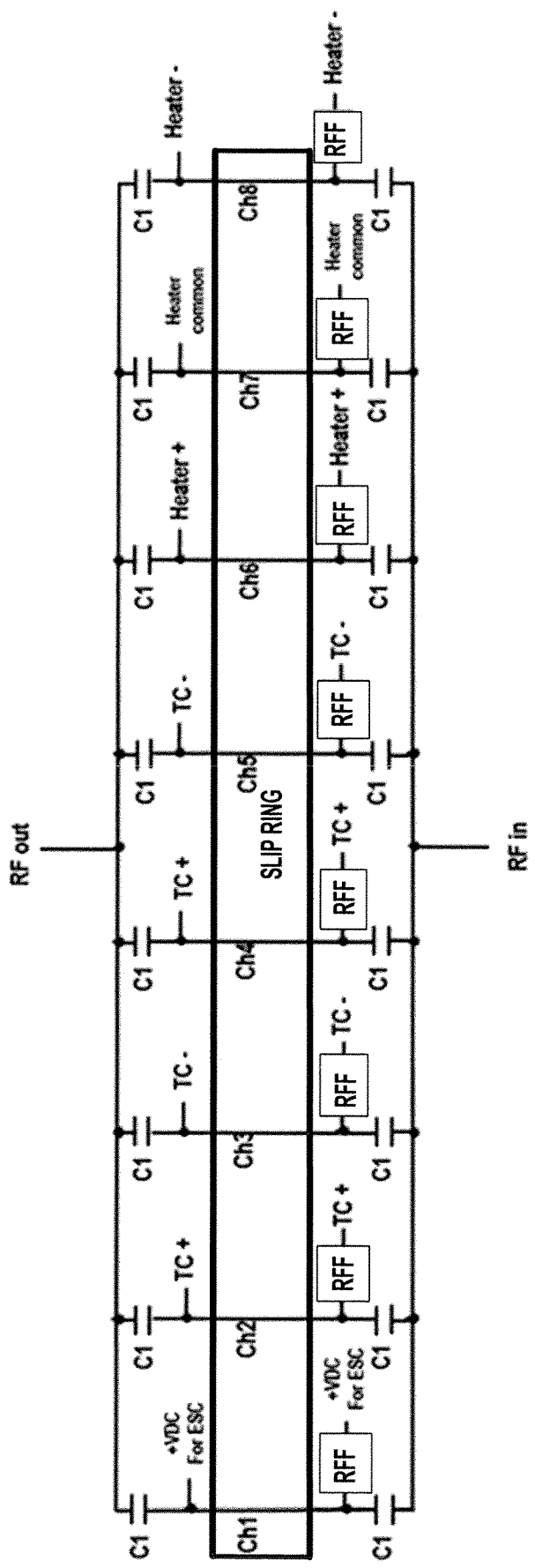
FIG. 7B is a circuit diagram of another isolation system, in accordance with some embodiments described in the present disclosure.

FIG. 7B is a diagram of an embodiment of an isolation system to illustrate mono-polar Electro Static Chucking (ESC). As illustrated in FIG. 7B, channel assignment is applicable for the mono-polar ESC. The ESC is a method for clamping the wafer 101 onto the pedestal 140 to improve film quality during semiconductor process by applying DC potential to the pedestal 140. There are two types of ESC, one is mono-polar ESC and another is bi-polar ESC. For the mono-polar ESC, a high positive DC voltage is allocated to the channel CH1 for providing to the pedestal 140 to attract the self-biased wafer 101, and a heater connection, e.g., a connection to the heater 416a or a connection to the heater element 416b, etc., is allocated to the channel CH6. In this manner, a voltage drop per channel CH1 through CH8 is minimal.

Figure 7C:
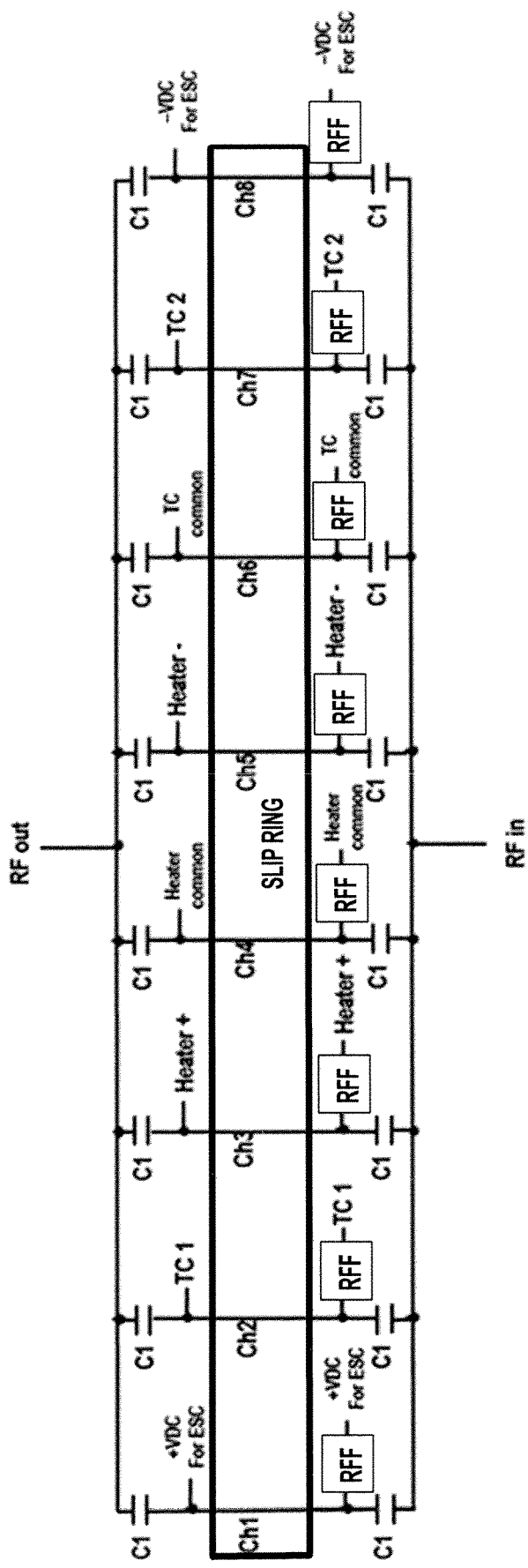
FIG. 7C is a circuit diagram of another isolation system, in accordance with some embodiments described in the present disclosure.

FIG. 7C is a diagram of an embodiment of an isolation system to illustrate the bi-polar ESC. For the bi-polar ESC, the ESC clamping voltage signals are assigned to the channels CH1 and CH8 to be located far away from each other. In this manner, a breakdown voltage is maximized on each channel CH1 and CH8. Moreover, for the application illustrated using FIG. 7C, DC power is provided to the heater elements 416a and 416b instead of AC to minimize voltage drop between adjacent ones of the channels CH1 to CH8 even further.

Figure 8:
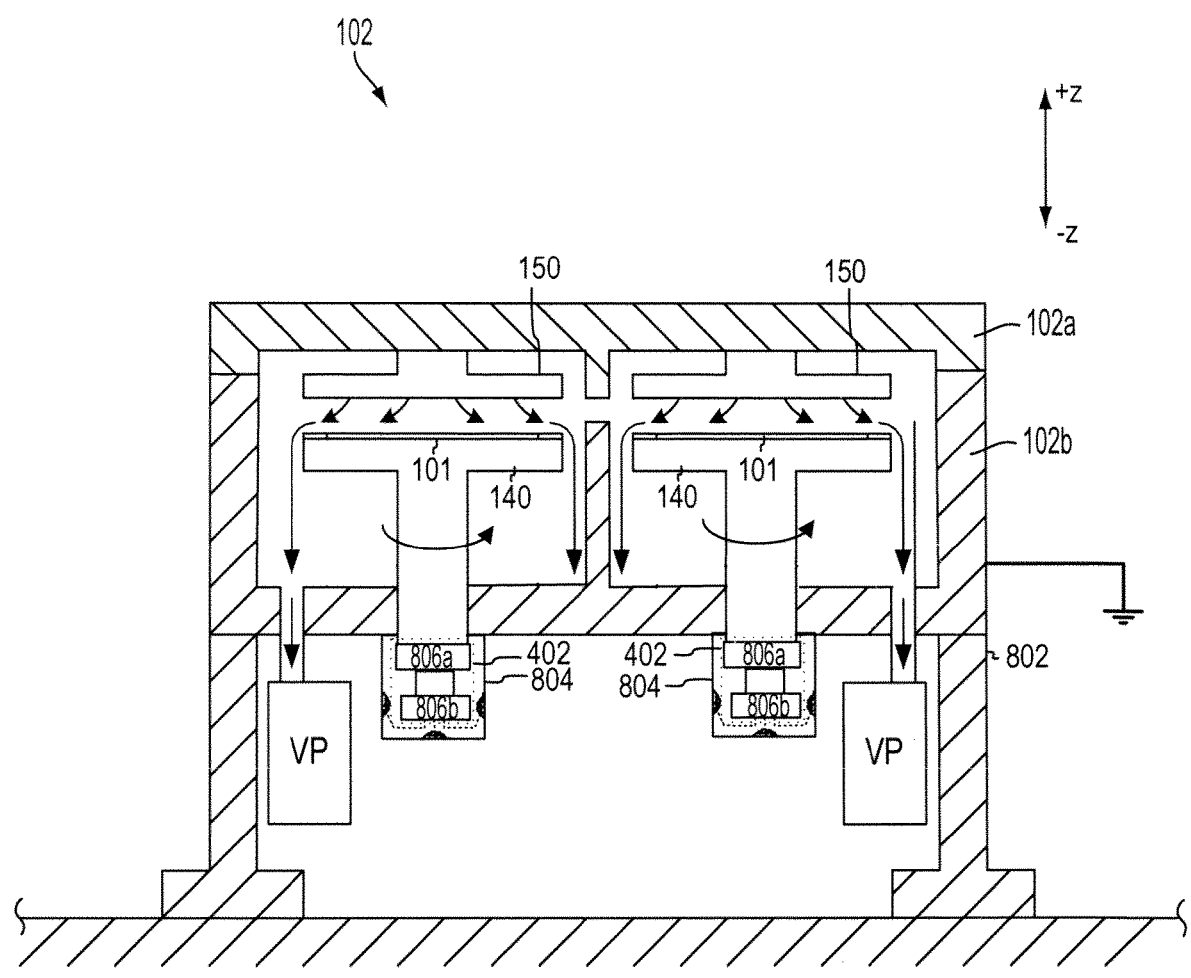
FIG. 8 is a diagram of an embodiment of a plasma chamber including a housing in which an isolation system is implemented, in accordance with several embodiments described in the present disclosure.

FIG. 8 is a diagram of an embodiment of the multi-station chamber 102. The showerheads 150 are lowered to be substantially aligned over the pedestal 140 of each station. The lower chamber portion 102b is supported by a support structure 802. The support structure 802 is any suitable structure capable of supporting the multi-station chamber 102, as well as facilities utilized to provide gases, RF power, pressure control, temperature control, timing, and associated controller and electronics. In some embodiments, the support structure 802 is defined from a metal tubular structure, which supports the chamber 102 above a surface (e.g., a clean room floor, etc.) in which the chamber 102 is installed. A housing 804 includes the isolation system 402. The housing 804 is for each station of the multi-station chamber 102. The housing 804 is attached to a bottom of the lower chamber portion 102b. The isolation system 402 has a top portion 806a, which includes the group 702a of top capacitors (FIG. 7A). The isolation system 402 further includes a bottom portion 806b, which includes the group 702b of bottom capacitors (FIG. 7A). The group 702a of top capacitors and a top portion of the slip ring are connected to the pedestal 140 to rotate with the pedestal 140. A bottom portion of the slip ring and the group 702b of bottom capacitors are stationary and do not rotate with the rotation of the pedestal 140. A vacuum pump (VP), e.g., a one or two stage mechanical dry pump and/or a turbomolecular pump, etc., for each station draws process gases out of the station and maintains a suitably low pressure within the station by a close loop controlled flow restriction device, such as a throttle valve or a pendulum valve, etc.

Figure 9A:
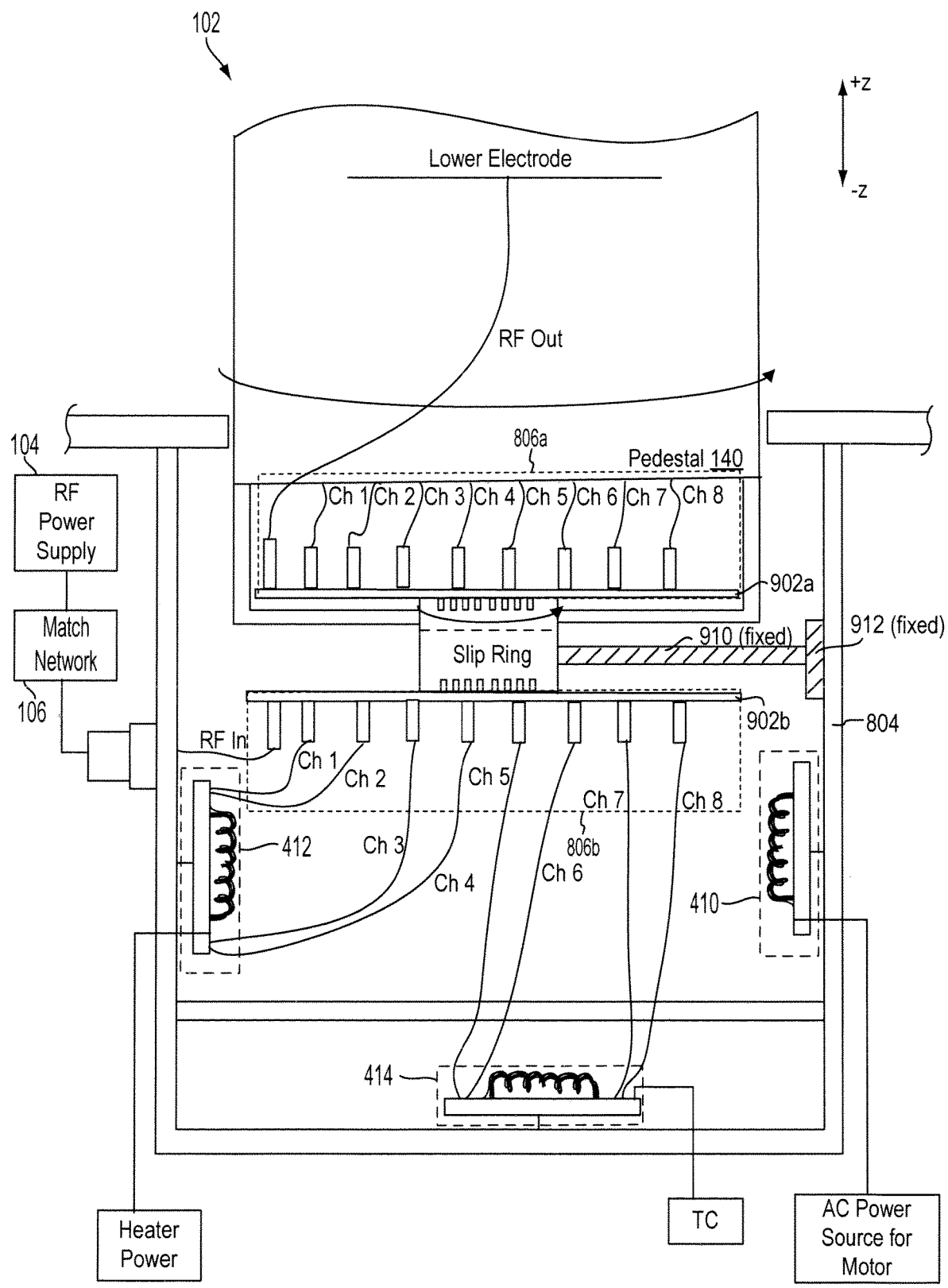
FIG. 9A is a block diagram of a system to illustrate a top portion and a bottom portion of an isolation system, in accordance with some embodiments described in the present disclosure.

FIG. 9A is a block diagram of an embodiment of a system 900 to illustrate the top portion 806a and the bottom portion 806b, which are connected to each other via the slip ring. The top portion 806a includes the top plate 902a and the bottom portion 806b includes the bottom plate 902b. The top plate 902a is an example of the top interface (FIG. 5C) and the bottom plate 902b is an example of the bottom interface (FIG. 5C). The top plate 902a and the bottom plate 902b are connected to each other via the slip ring. The top plate 902a has laid thereon and attached thereto a plurality of connectors of the channels CH1 thru CH8 and of the RF output. The connectors on the top plate 902a of the channels CH1 and CH2 connect to the heater element 416a and the connectors on the top plate 902a of the channels CH3 and CH4 connect to the heater element 416b. Moreover, the connectors on the top plate 902a of the channels CH5 and CH6 connect to the thermocouple 418a and the connectors on the top plate 902a of the channels CH7 and CH8 connect to the thermocouple 418b. Moreover, a connector located on the top plate 902a is the RF output and connects to the lower electrode.

Similarly, the bottom plate 902b has laid underneath and affixed thereto a plurality of connectors of the channels CH1 thru CH8 and of the RF input. The connectors under the bottom plate 902b of the channels CH1, CH2, CH3 and CH4 connect to the filter 412. Moreover, the connectors under the bottom plate 902b of the channels CH5, CH6, CH7 and CH4 connected to the filter 414. Moreover, a connector located under the bottom plate 902b is the RF input and is connected to the match network 106. The bottom portion of the slip ring is fixed via an arm 910 to a bracket 912, which is attached to the housing 804.

Figure 9B:
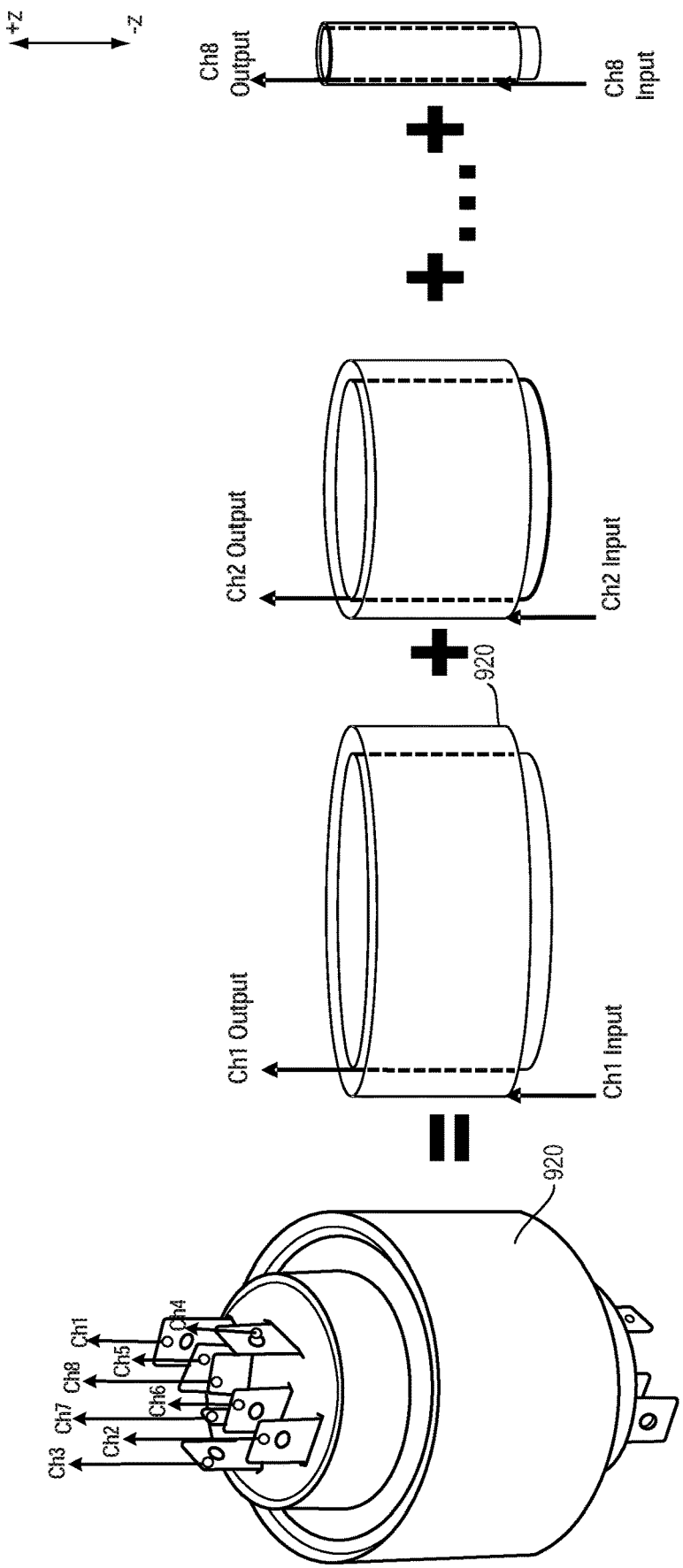
FIG. 9B is a diagram of a housing of a slip ring to illustrate placement of multiple channels within an isolation system, in accordance with various embodiments described in the present disclosure.

FIG. 9B is a diagram of an embodiment of a housing 920 of the slip ring to illustrate locations of the channels CH1 thru CH8. As shown, the slip ring includes a plurality of connectors of the channels CH1 thru CH8. The connectors of the channels CH1 thru CH8 are located on and attached to a top surface of the housing 920. The connectors attached to the top surface of the housing 920 are connected to the top plate 902a (FIG. 9A). The connectors on the top surface of the housing 902 are located in a radial order. For example, the connector of the channel CH1 is located in a first radial region from a center of the housing 902, the connector of the channel CH2 is located in a second radial region from the center of the housing 902, the connector of the channel CH3 is located in a third radial region from the center of the housing 902, the connector of the channel CH4 is located in a fourth radial region from the center of the housing 902, the connector of the channel CH5 is located in a fifth radial region from the center of the housing 902, the connector of the channel CH6 is located in a sixth radial region from the center of the housing 902, the connector of the channel CH7 is located in a seventh radial region from the center of the housing 902, and the connector of the channel CH8 is located in an eighth radial region from the center of the housing 902. The first radial region has a radius greater than a radius of the second radial region. The second radial region has a radius greater than a radius of the third radial region. The third radial region has a radius greater than a radius of the fourth radial region. The fourth radial region has a radius greater than a radius of the fifth radial region. The fifth radial region has a radius greater than a radius of the sixth radial region. The sixth radial region has a radius greater than a radius of the seventh radial region. The seventh radial region has a radius greater than a radius of the eighth radial region.

Connectors of the channels CH1 thru CH8 are located under and attached to a bottom surface of the housing 920. The connectors attached to the bottom surface of the housing 920 are connected to the bottom plate 902b (FIG. 9A). The connectors under the bottom surface of the housing 902 are located in the radial order. For example, the connector of the channel CH1 is located in the first radial region, the connector of the channel CH2 is located in the second radial region, the connector of the channel CH3 is located in the third radial region, the connector of the channel CH4 is located in the fourth radial region, the connector of the channel CH5 is located in the fifth radial region, the connector of the channel CH6 is located in the sixth radial region, the connector of the channel CH7 is located in the seventh radial region, and the connector of the channel CH8 is located in the eighth radial region.

In some embodiments, the housing 920 is an off-the-shelf housing and includes a rotor, which is connected to the bottom plate 902b (FIG. 9A) to rotate the bottom plate 902b with respect to the top plate 902a (FIG. 9A).

FIG. 10A is a top view of the top plate 902a (FIG. 9A) or a bottom view of the bottom plate 902b (FIG. 9A). For example, the top view of the top plate 902a is a view looking down in a −z direction, illustrated above in FIG. 9A. As another example, the bottom view of the bottom plate 902b is a view looking up in a +z direction, illustrated above in FIG. 9A.

The plate illustrated in FIG. 10A has laid thereon and affixed thereto a plurality of groups of capacitors. For example, the plate has attached to its surface, a group 1002a of capacitors of the channel CH1, a group 1002b of capacitors of the channel CH2, a group 1002c of capacitors of the channel CH3, a group 1002d of capacitors of the channel CH4, a group 1002e of capacitors of the channel CH5, a group 1002*f* of capacitors of the channel CH6, a group 1002*g* of capacitors of the channel CH7, and a group 1002*h* of capacitors of the channel CH8. Each of the groups 1002*a*, 1002*b*, 1002*c*, 1002*d*, 1002*e*, 1002*f*, 1002*g*, and 1002*h* is connected to the RF output via a connection path 1004, e.g., a strip, a conductor, etc., when the plate illustrated in FIG. 10A is the top plate 902*a* and is connected to the RF input via the connection path 1004 when the plate illustrated in FIG. 10A is the bottom plate 902*b*.

When the plate illustrate in FIG. 10A is the top plate 902*a*, a plurality of connectors CTOR1, CTOR2, CTOR3, and CTOR4 attached to the top surface of the top plate 902*a* are connected to the heater elements 416*a* and 416*b* a plurality of connectors CTOR4 and CTOR5 are connected to the thermocouples 418*a* and 418*b*. Moreover, when the plate illustrate in FIG. 10A is the bottom plate 902*b*, the connectors CTOR1, CTOR2, CTOR3, and CTOR4 attached to the bottom surface of the bottom plate 902*b* are connected to the filter 412 (FIG. 9A) for the heater elements 416*a* and 416*b* and the connectors CTOR4 and CTOR5 are connected to the filter 414 (FIG. 9A) for the thermocouples 418*a* and 418*b*.

FIG. 10B is a bottom view of the top plate 902*a* (FIG. 9A) or a top view of the bottom plate 902*b* (FIG. 9A). For example, the bottom view of the top plate 902*a* is a view looking up in the +z direction, illustrated above in FIG. 9A. As another example, the top view of the bottom plate 902*b* is a view looking down in the +z direction, illustrated above in FIG. 9A.

The plate illustrated in FIG. 10B is the same as that illustrated in FIG. 10A and has laid thereon and affixed thereto a plurality of groups of capacitors. For example, the plate has attached to its surface, a group 1010*a* of capacitors of the channel CH1, a group 1010*b* of capacitors of the channel CH2, a group 1010*c* of capacitors of the channel CH3, a group 1010*d* of capacitors of the channel CH4, a group 1010*e* of capacitors of the channel CH5, a group 1010*f* of capacitors of the channel CH6, a group 1010*g* of capacitors of the channel CH7, and a group 1010*h* of capacitors of the channel CH8. The group 1010*a* is connected to the group 1002*a* through a via in the plate, the group 1010*b* is connected to the group 1002*b* through a via in the plate, the group 1010*c* is connected to the group 1002*c* through a via in the plate, the group 1010*d* is connected to the group 1002*d* through a via in the plate, the group 1010*e* is connected to the group 1002*e* through a via in the plate, the group 1010*f* is connected to the group 1002*f* through a via in the plate, the group 1010*g* is connected to the group 1002*g* through a via in the plate, and the group 1010*h* is connected to the group 1002*h* through a via in the plate.

When the plate illustrated in FIG. 10B is the top plate 902*a*, the group 1010*a* is connected to the connector of the channel CH1 of the top portion of the slip ring, the group 1010*b* is connected to the connector of the channel CH2 of the top portion of the slip ring, the group 1010*c* is connected to the connector of the channel CH3 of the top portion of the slip ring, and the group 1010*d* is connected to the connector of the channel CH4 of the top portion of the slip ring. Moreover, when the plate illustrate in FIG. 10B is the top plate 902*a*, the group 1010*e* is connected to the connector of the channel CH5 of the top portion of the slip ring, the group 1010*f* is connected to the connector of the channel CH6 of the top portion of the slip ring, the group 1010*g* is connected to the connector of the channel CH7 of the top portion of the slip ring, and the group 1010*h* is connected to the connector of the channel CH8 of the top portion of the slip ring.

When the plate illustrated in FIG. 10B is the bottom plate 902*b*, the group 1010*a* is connected to the connector of the channel CH1 of the bottom portion of the slip ring, the group 1010*b* is connected to the connector of the channel CH2 of the bottom portion of the slip ring, the group 1010*c* is connected to the connector of the channel CH3 of the bottom portion of the slip ring, and the group 1010*d* is connected to the connector of the channel CH4 of the bottom portion of the slip ring. Moreover, when the plate illustrate in FIG. 10B is the bottom plate 902*b*, the group 1010*e* is connected to the connector of the channel CH5 of the bottom portion of the slip ring, the group 1010*f* is connected to the connector of the channel CH6 of the bottom portion of the slip ring, the group 1010*g* is connected to the connector of the channel CH7 of the top portion of the slip ring, and the group 1010*h* is connected to the connector of the channel CH8 of the bottom portion of the slip ring.

When the plate illustrated in FIGS. 10A and 10B is the top plate 902*a*, the capacitors of the groups 1002*a* and 1010*a* together form the top capacitor C1 of the channel CH1, the capacitors of the groups 1002*b* and 1010*b* together form the top capacitor C1 of the channel CH2, the capacitors of the groups 1002*c* and 1010*c* together form the top capacitor C1 of the channel CH3, the capacitors of the groups 1002*d* and 1010*d* together form the top capacitor C1 of the channel CH4, and the capacitors of the groups 1002*e* and 1010*e* together form the top capacitor C1 of the channel CH5. Moreover, when the plate illustrate in FIGS. 10A and 10B is the top plate 902*a*, the capacitors of the groups 1002*f* and 1010*f* together form the top capacitor C1 of the channel CH6, the capacitors of the groups 1002*g* and 1010*g* together form the top capacitor C1 of the channel CH7, and the capacitors of the groups 1002*h* and 1010*h* together form the top capacitor C1 of the channel CH8.

When the plate illustrated in FIGS. 10A and 10B is the bottom plate 902*b*, the capacitors of the groups 1002*a* and 1010*a* together form the bottom capacitor C1 of the channel CH1, the capacitors of the groups 1002*b* and 1010*b* together form the bottom capacitor C1 of the channel CH2, the capacitors of the groups 1002*c* and 1010*c* together form the bottom capacitor C1 of the channel CH3, the capacitors of the groups 1002*d* and 1010*d* together form the bottom capacitor C1 of the channel CH4, and the capacitors of the groups 1002*e* and 1010*e* together form the bottom capacitor C1 of the channel CH5. Moreover, when the plate illustrate in FIGS. 10A and 10B is the bottom plate 902*b*, the capacitors of the groups 1002*f* and 1010*f* together form the bottom capacitor C1 of the channel CH6, the capacitors of the groups 1002*g* and 1010*g* together form the bottom capacitor C1 of the channel CH7, and the capacitors of the groups 1002*h* and 1010*h* together form the bottom capacitor C1 of the channel CH8.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A slip ring assembly comprising:
a first circuit channel having a first filter, a slip ring portion, and a second filter, wherein the slip ring portion of the first circuit channel is coupled between the first and second filters of the first circuit channel, wherein the first and second filters of the first circuit channel are configured to filter non-radio frequency (RF) power; and
a second circuit channel having a first filter, a slip ring portion, and a second filter, wherein the slip ring portion of the second circuit channel is coupled between the first and second filters of the second circuit channel, wherein the first and second filters of the second circuit channel are configured to filter non-RF power,
wherein the first circuit channel is coupled to the second circuit channel.

2. The slip ring assembly of claim 1, wherein the first filter of the first circuit channel is a first capacitor and the second filter of the first circuit channel is a second capacitor, wherein the slip ring portion of the first circuit channel is a coupling between the first capacitor and the second capacitor.

3. The slip ring assembly of claim 2, wherein the first capacitor has a first end and a second end, wherein the second capacitor has a first end and a second end, wherein the slip ring portion of the first circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a heater element of the plasma chamber.

4. The slip ring assembly of claim 3, wherein the first end of the second capacitor is configured to be coupled to a power source via an RF filter to receive non-RF power via the RF filter and the second end of the second capacitor is configured to be coupled to a distributor and combiner to receive RF power from the distributor and combiner.

5. The slip ring assembly of claim 2, wherein the first capacitor has a first end and a second end, wherein the second capacitor has a first end and a second end, wherein the slip ring portion of the first circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a thermocouple associated with the plasma chamber.

6. The slip ring assembly of claim 5, wherein the first end of the second capacitor is configured to be coupled to a controller via an RF filter to transfer non-RF power via the RF filter to the controller and the second end of the second capacitor is configured to be coupled to a distributor and combiner to receive RF power from the distributor and combiner.

7. The slip ring assembly of claim 1, wherein the first filter of the second circuit channel is a first capacitor and the second filter of the second circuit channel is a second capacitor, wherein the slip ring portion of the second circuit channel is a coupling between the first capacitor and the second capacitor.

8. The slip ring assembly of claim 7, wherein the first capacitor has a first end and a second end, wherein the second capacitor has a first end and a second end, wherein the slip ring portion of the second circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a heater element of the plasma chamber.

9. The slip ring assembly of claim 8, wherein the first end of the second capacitor is configured to be coupled to a power source via an RF filter to receive non-RF power via the RF filter and the second end of the second capacitor is configured to be coupled to a distributor and combiner to receive RF power from the distributor and combiner.

10. The slip ring assembly of claim 7, wherein the first capacitor has a first end and a second end, wherein the second capacitor has a first end and a second end, wherein the slip ring portion of the second circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a thermocouple associated with the plasma chamber.

11. The slip ring assembly of claim 10, wherein the first end of the second capacitor is configured to be coupled to a controller via an RF filter to transfer non-RF power via the RF filter to the controller and the second end of the second capacitor is configured to be coupled to a distributor and combiner to receive RF power from the distributor and combiner.

12. A plasma system comprising:
a first radio frequency (RF) generator configured to generate a first RF signal;
a second RF generator configured to generate a second RF signal;
a first impedance matching circuit coupled to the first RF generator, wherein the first impedance matching circuit is configured to output a first modified RF signal upon receiving the first RF signal;
a second impedance matching circuit coupled to the second RF generator, wherein the second impedance matching circuit is configured to output a second modified RF signal upon receiving the second RF signal;
a combiner and distributor coupled to the first impedance matching circuit and the second impedance matching circuit, wherein the combiner and distributor is configured to receive the first and second modified RF signals to output a plurality of output RF signals;
a slip ring assembly coupled to the combiner and distributor for receiving one of the plurality of output RF signals, wherein the slip ring assembly includes:

a first circuit channel having a first filter, a slip ring portion, and a second filter, wherein the slip ring portion of the first circuit channel is coupled between the first and second filters of the first circuit channel, wherein the first filter of the first circuit channel is configured to filter non-RF power and allow passage of RF power of the one of the plurality of output RF signals; and a second circuit channel having a first filter, a slip ring portion, and a second filter, wherein the slip ring portion of the second circuit channel is coupled between the first and second filters of the second circuit channel, wherein the first filter of the second circuit channel is configured to filter non-RF power and allow passage of RF power of the one of the plurality of output RF signals, wherein the first circuit channel is coupled to the second circuit channel.

13. The plasma system of claim 12, wherein the first filter of the first circuit channel is a first capacitor and the second filter of the first circuit channel is a second capacitor, wherein the slip ring portion of the first circuit channel is a coupling between the first capacitor and the second capacitor.

14. The plasma system of claim 13, wherein the first capacitor has a first end and a second end, wherein the second capacitor has a first end and a second end, wherein the slip ring portion of the first circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a heater element of the plasma chamber.

15. The plasma system of claim 14, wherein the first end of the second capacitor is configured to be coupled to a power source via an RF filter to receive non-RF power via the RF filter and the second end of the second capacitor is configured to be coupled to the combiner and distributor to receive RF power of the one of the plurality of output RF signals from the combiner and distributor.

16. The plasma system of claim 13, wherein the first capacitor has a first end and a second end, wherein the second capacitor has a first end and a second end, wherein the slip ring portion of the first circuit channel is coupled to the first end of the first capacitor and is coupled to the first end of the second capacitor, wherein the second end of the first capacitor is configured to be coupled to an electrode of a plasma chamber and the first end of the first capacitor is configured to be coupled to a thermocouple associated with the plasma chamber.

17. The plasma system of claim 16, wherein the first end of the second capacitor is configured to be coupled to a controller via an RF filter to transfer non-RF power via the RF filter to the controller and the second end of the second capacitor is configured to be coupled to the combiner and distributor to receive RF power of the one of the plurality of output RF signals from the combiner and distributor.

18. The plasma system of claim 12, wherein the first filter of the second circuit channel is a first capacitor and the second filter of the second circuit channel is a second capacitor, wherein the slip ring portion of the second circuit channel is a coupling between the first capacitor and the second capacitor.

19. A method comprising:

receiving, by a first circuit channel of a slip ring assembly, non-radio frequency (RF) power and RF power;

filtering, by a first filter and a second filter of the first circuit channel, the non-RF power received by the first circuit channel;

allowing, by a slip ring portion of the first circuit channel, passage of the non-RF power received by the first circuit channel;

receiving, by a second circuit channel of the slip ring assembly, non-RF power and RF power;

filtering, by a first filter and a second filter of the second circuit channel, the non-RF power received by the second circuit channel; and allowing, by a slip ring portion of the second circuit channel, passage of the non-RF power received by the second circuit channel.

20. The method of claim 19, wherein the non-RF power is alternating current (AC) power or direct current (DC) power.

* * * * *